United States Patent
Tsatsaragkos et al.

(10) Patent No.: US 8,739,001 B2
(45) Date of Patent: May 27, 2014

(54) LDPC ENCODING AND DECODING TECHNIQUES

(75) Inventors: Ioannis Tsatsaragkos, Athens (GR); Ahmed Mahdi, Patras (GR); Nikolaos Kanistras, Patras (GR); Vasileios Paliouras, Patras (GR)

(73) Assignee: Analogies SA, Patras (GR)

( * ) Notice: Subject to any disclaimer, the term of this patent is extended or adjusted under 35 U.S.C. 154(b) by 0 days.

(21) Appl. No.: 13/454,086

(22) Filed: Apr. 24, 2012

(65) Prior Publication Data

US 2013/0283131 A1 Oct. 24, 2013

Related U.S. Application Data

(60) Provisional application No. 61/478,490, filed on Apr. 23, 2011.

(51) Int. Cl.
*H03M 13/00* (2006.01)

(52) U.S. Cl.
USPC .................. 714/776; 714/755; 714/758

(58) Field of Classification Search
USPC ............ 714/776, 755, 752, 758, 801, 804
See application file for complete search history.

(56) References Cited

U.S. PATENT DOCUMENTS

| | | | | |
|---|---|---|---|---|
| 7,752,529 | B2 * | 7/2010 | Lee et al. | 714/785 |
| 8,145,987 | B2 * | 3/2012 | Shen et al. | 714/804 |
| 8,370,731 | B2 * | 2/2013 | Shen et al. | 714/804 |
| 8,433,984 | B2 * | 4/2013 | Khandekar et al. | 714/779 |

* cited by examiner

*Primary Examiner* — Fritz Alphonse

(74) *Attorney, Agent, or Firm* — DP IP Group; Franco S. De Liguori

(57) ABSTRACT

An improved LDPC encoding and encoding and associated architectures therefor are described. In one exemplary embodiment, a set of parity bits (p) are generated from a set of information bits (s), by storing information related to z×z sub-matrices of a first sub-matrix and of a second sub-matrix corresponding to a first and a second portion of a parity check matrix H of an LDPC code, to allow representation of the parity check matrix in a compressed form and by generating the set of parity bits p by appropriately multiplying, shifting and accumulating subsets from the set of information bits s based on the stored information, without decompressing the parity check matrix. Further relevant techniques are also described.

14 Claims, 38 Drawing Sheets

$$\begin{pmatrix}
0 & 0 & 0 & 0 & 1 & 0 & 0 & 0 & 1 & 0 & 0 & 0 & 0 \\
0 & 0 & 0 & 0 & 1 & 0 & 0 & 1 & 0 & 0 & 0 & 1 & 0 \\
0 & 0 & 0 & 0 & 1 & 0 & 1 & 0 & 0 & 1 & 0 & 0 & 0 \\
0 & 0 & 0 & 0 & 1 & 0 & 1 & 0 & 0 & 0 & 0 & 0 & 1 \\
0 & 0 & 0 & 1 & 0 & 0 & 0 & 0 & 1 & 0 & 1 & 0 & 0 \\
0 & 0 & 0 & 1 & 0 & 0 & 0 & 0 & 1 & 0 & 0 & 0 & 0 \\
0 & 0 & 0 & 1 & 0 & 0 & 0 & 1 & 0 & 0 & 0 & 0 & 1 \\
0 & 0 & 0 & 1 & 0 & 1 & 0 & 0 & 0 & 0 & 0 & 1 & 0 \\
0 & 0 & 1 & 0 & 0 & 0 & 0 & 0 & 1 & 1 & 0 & 0 & 0 \\
0 & 0 & 1 & 0 & 0 & 0 & 0 & 0 & 1 & 0 & 0 & 1 & 0 & 0 \\
0 & 0 & 1 & 0 & 0 & 0 & 1 & 0 & 0 & 0 & 0 & 0 & 0 \\
0 & 0 & 1 & 0 & 0 & 1 & 0 & 0 & 0 & 0 & 0 & 0 & 1 \\
0 & 1 & 0 & 0 & 0 & 0 & 0 & 0 & 1 & 0 & 0 & 1 & 0 \\
0 & 1 & 0 & 0 & 0 & 0 & 1 & 0 & 0 & 0 & 1 & 0 & 0 \\
0 & 1 & 0 & 0 & 0 & 1 & 0 & 0 & 0 & 1 & 0 & 0 & 0 \\
0 & 1 & 0 & 0 & 0 & 1 & 0 & 0 & 0 & 0 & 0 & 0 & 0 \\
1 & 0 & 0 & 0 & 0 & 0 & 0 & 1 & 0 & 0 & 0 & 0 & 1 \\
1 & 0 & 0 & 0 & 0 & 0 & 1 & 0 & 0 & 0 & 0 & 1 & 0 \\
1 & 0 & 0 & 0 & 0 & 1 & 0 & 0 & 0 & 0 & 1 & 0 & 0 \\
1 & 0 & 0 & 0 & 1 & 0 & 0 & 0 & 0 & 1 & 0 & 0 & 0 \\
\end{pmatrix}$$

FIG. 2

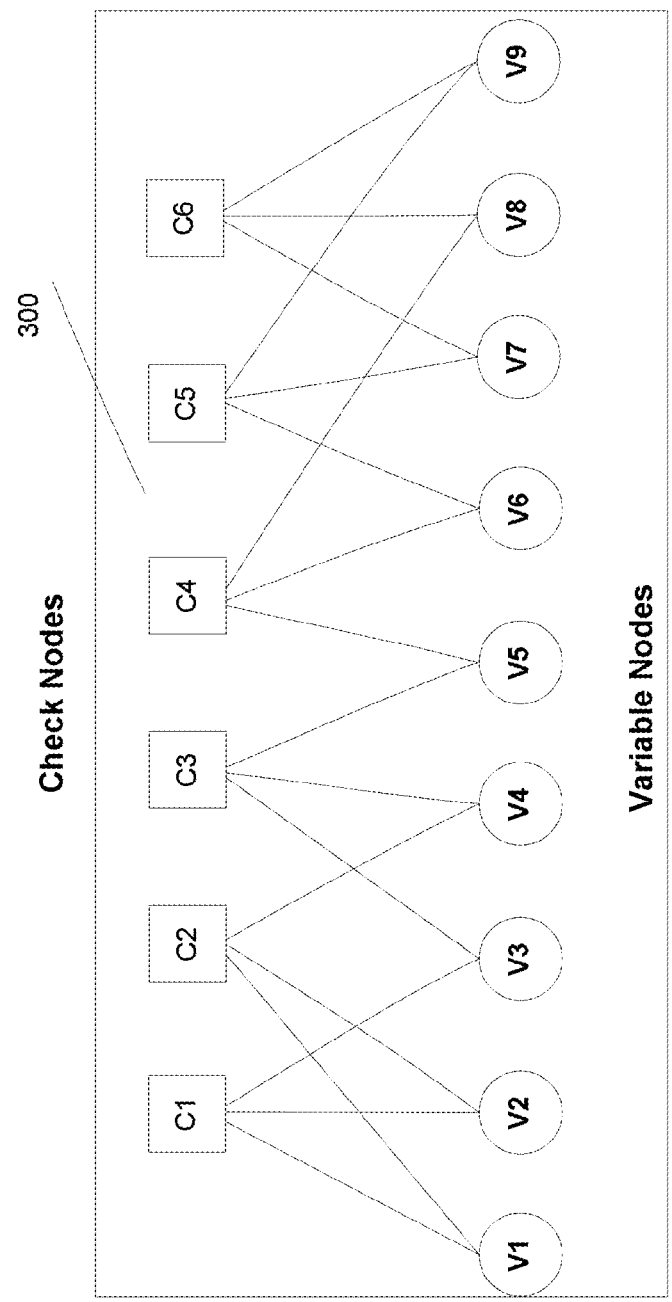

FIG. 5

| | |
|---|---|
| 010011010 | 11 |
| 001001101 | 00 |
| 011001001 | 10 |
| 001110010 | 01 |
| ..... | .. |
| ..... | .. |
| .... | .. |
| .... | .. |
| 010110101 | .. |
| ...... | |
| | |
| | |
| | |
| | |
| 100100100 | 10 |

Index of non-zero submatrices 3311

Shifting factor 3312

LDPC ENCODING AND DECODING TECHNIQUES

RELATED APPLICATIONS

This application claims the benefit of U.S. Provisional Application No. 61/478,490, filed on Apr. 23, 2011, commonly owned and assigned to the same assignee hereof.

FIELD

The present disclosure relates to communications and more specifically to encoding and decoding employing Low Density Parity Check (LDPC) codes.

BACKGROUND

During the last few years, there is an ever increasing need for effective and reliable digital communication and data storage systems. This need has been enhanced by the usage of large and high-speed data networks for the exchange, processing and storage of digital information. One big issue related to the design of such systems is error correction to ensure error-free communication during data transmission.

FIG. 1 shows communication system 100 according to an exemplary embodiment. Information Source 110 provides Transmitter 120 with source data. Transmitter 120 includes Source Encoder 122 coupled to Channel Encoder 124 coupled to Modulator 126. Source Encoder 122 receives source data from information source 110 and encodes the source data to generate encoded data. Channel Encoder 124 receives encoded data from Source Encoder 122 and generates Channel data. Modulator 126 receives Channel data from Channel Encoder 124 and generates Modulated data. Modulated data is transmitted over Channel 130. Channel 130 may be a wireless or wired communication channel. Channel 130 is prone to noise. Noise is added to modulated data over Channel 130. Receiver 140 receives noisy data comprising modulated data and noise. Receiver 140 includes Demodulator 142 coupled to Channel Decoder 144 coupled to Source Decoder 146. Demodulator 142 receives the noisy data and demodulates the noisy data to generate demodulated data. Channel decoder 144 receives demodulated data from Demodulator 142 and generates Channel data. Source decoder 146 receives channel data from Channel Decoder 144. Source Decoder 146 decodes the channel data and generates the source data originally provided to Transmitter 120. Receiver 140 is coupled to Destination 150 to provide Destination 150 with the source data.

As is known by Shannon's code theory, it is possible to reduce the possibility of error reception through a noisy channel provided that the transmission rate does not exceed the channel capacity. More specifically, for a channel having bandwidth (B) and signal-to-noise ratio (SNR), the channel capacity (C), i.e. the maximum error-free transmission rate, in bits per second (BPS) is given by:

$$C = B \log_2(1+SNR) \quad \text{(Equation 1)}$$

By properly encoding of data, errors can be minimized to whatever level is desired without reducing the transmission rate. Nevertheless, the lower the desired error rate is the more complex the required encoding shall be.

The purpose of channel encoding is to minimize the possibility of erroneous transmission. The error correcting code used as well as the encoding-decoding processes define to a large extent the system throughput. Error correcting codes are split into two large categories: Block Codes and Convolutional Codes.

Block Codes are characterized by the segmentation of data to be transmitted into K symbol length blocks and corresponding N symbol length blocks called codewords, where $N \geq K$. A block code is considered linear if each linear combination of two codewords is also a codeword.

The transformation of a K bit length sequence (K data) to an N bit length sequence (codeword) is accomplished with the help of a K×N binary matrix called Generator Matrix (G). The code-word ($c_i$) is generated by multiplying the K data with the matrix G.

$$c_i = u_i \otimes G \quad \text{(Equation 2)}$$

Low-Density Parity Check (LDPC) codes are a subcategory of linear block codes. LDPC codes are characterized by an LDPC parity check matrix (H) and a corresponding Tanner graph. Decoding is performed through an iterative process of information exchange between two processing unit types.

For LDPC codes an LDPC matrix H must fulfil the following equation:

$$c_i \otimes H^T = 0 \quad \text{(Equation 3)}$$

An LDPC code having a Parity Check matrix with equal number of non-zero components for each row ($d_r$) and for each column ($d_c$) of the matrix, respectively, is called a regular LDPC code.

FIG. 2 shows a small-scale example of a parity check matrix (H) of a regular LDPC code. Each column and row of the matrix comprises an equal number of elements of value of either one or zero.

FIG. 3 depicts the relation of the H matrix with the corresponding Tanner graph 300 by means of an example. Rows in matrix H correspond to Check Nodes, marked as squares, while columns in matrix H correspond to Variable Nodes, marked as circles in the Tanner graph 300. The code depicted is a (9, 2, 3)-LDPC code. There are 9 columns in H, each column having 2 "1"s and each row 3 "1"s, respectively. The 9 variable nodes and the 6 Check Nodes in the Tanner diagram represent the 9 columns and the 6 rows of H, respectively. The connections represent the "1"s.

LDPC code design techniques are divided into two categories: (i) random code construction and (ii) structured code construction. LDPC matrices designed with a random code construction technique have no limitation as to their structure. Good random codes have a performance close to the theoretical Shannon limit. However, an encoder-decoder system based on such a code requires high die area and complex connectivity due to the lack of structure of the matrix H. On the other hand, structured LDPC codes are based on specific arithmetic structures. As a consequence, the structure of the matrix may be exploited to achieve low complexity and less die area as well as linear-time encoding and parallel encoding/decoding processes.

A sub-category of structured LDPC codes are the Quasi-Cyclic LDPC codes.

FIG. 4 depicts an example parity-check matrix H composed of circularly shifted identity sub-matrices. Nonzero elements (ones) are represented as dots. Zeros are not shown. The variable degrees that appear in the particular matrix are also shown. LDPC codes the parity check matrix of which has this structure are the Quasi-Cyclic LDPC codes (QC-LDPC). QC-LDPC codes are comprised of square sub-matrices of size z. Each sub-matrix is either a z×z zero sub-matrix or a z×z identity sub-matrix with a right circulant shifting factor having a value of s.

Figure 5:
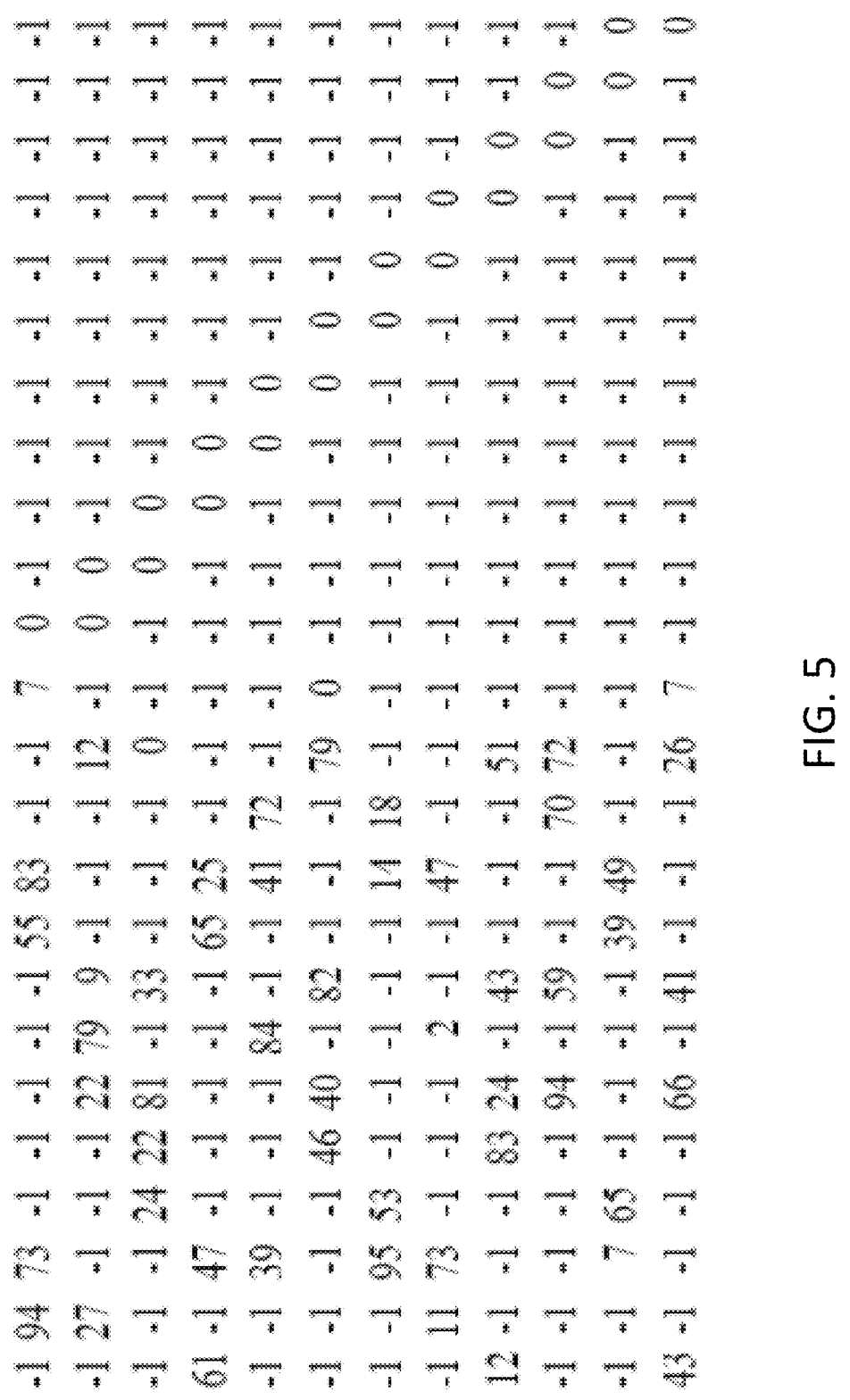

FIG. 5 depicts a compressed representation of a parity-check matrix corresponding to a quasi-cyclic LDPC code. In the particular example minus one represents an all zero z×z matrix, while nonnegative integers are shift factors, applied to z×z identity matrices in order to derive the actual parity check matrix, which is of the structure depicted in FIG. 4. In this example, the codeword length N=2304, z=96 and the code rate R=½.

QC-LDPC codes are used widely in present LDPC encoding-decoding systems. QC-LDPC codes have prevailed as they demand low die area both for the encoder and the decoder. The complexity of the encoding procedure is not dependant only on the algorithm employed but also in the memory management during storage of the H matrix. A reduction in the required storage memory leads to a reduction in required hardware. Thus lower die area is accomplished.

Storage management of the matrix H is a significant contributor to lower die area, however, the compression method should not increase the difficulty in the encoding process. The use of other assets for translating the compressed information may lead to additional hardware or extra clock cycles which is not desirable.

One known way to deal with memory management and decoding speed is to exploit the parallel encoding/decoding capabilities of QC LDPC codes. This can be achieved by having more than one levels of parallelism. However, this results in circuits that are more die intensive. Therefore there is a need for a design technique that optimizes the management of the trade-off between decoding speed and hardware complexity.

BRIEF DESCRIPTION OF THE DRAWINGS

FIG. 2 shows a small-scale example of a parity check matrix (H) of a regular LDPC code.

FIG. 3 depicts the relation of the H matrix with the corresponding Tanner graph 300 by means of an example.

FIG. 5 depicts a compressed representation of a parity-check matrix corresponding to a quasi-cyclic LDPC code.

FIG. 31 depicts the organization of words stored in ROM_H1 3300 (1820).

SUMMARY

Figure 1:
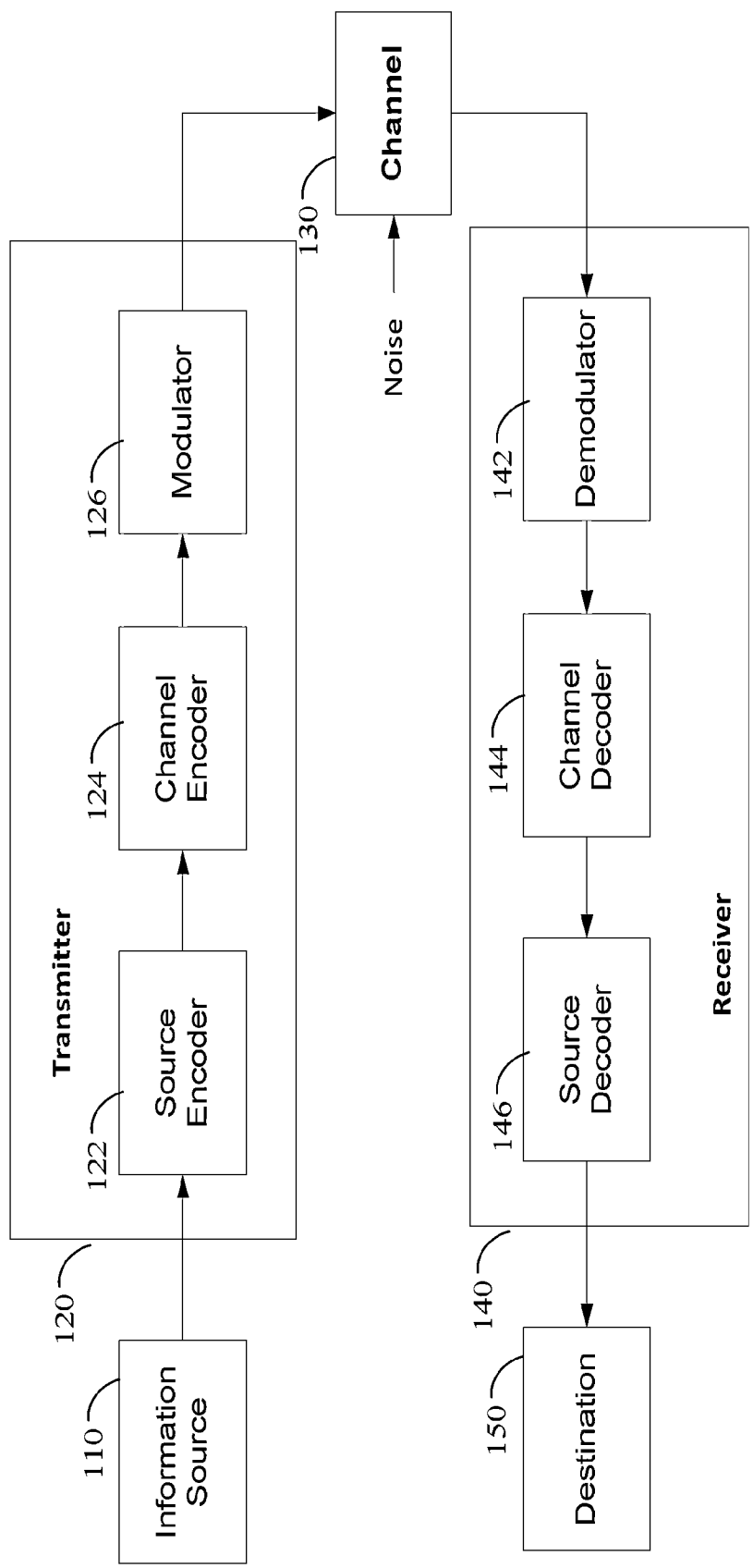
FIG. 1 shows communication system 100 according to an exemplary embodiment.
Figure 4:
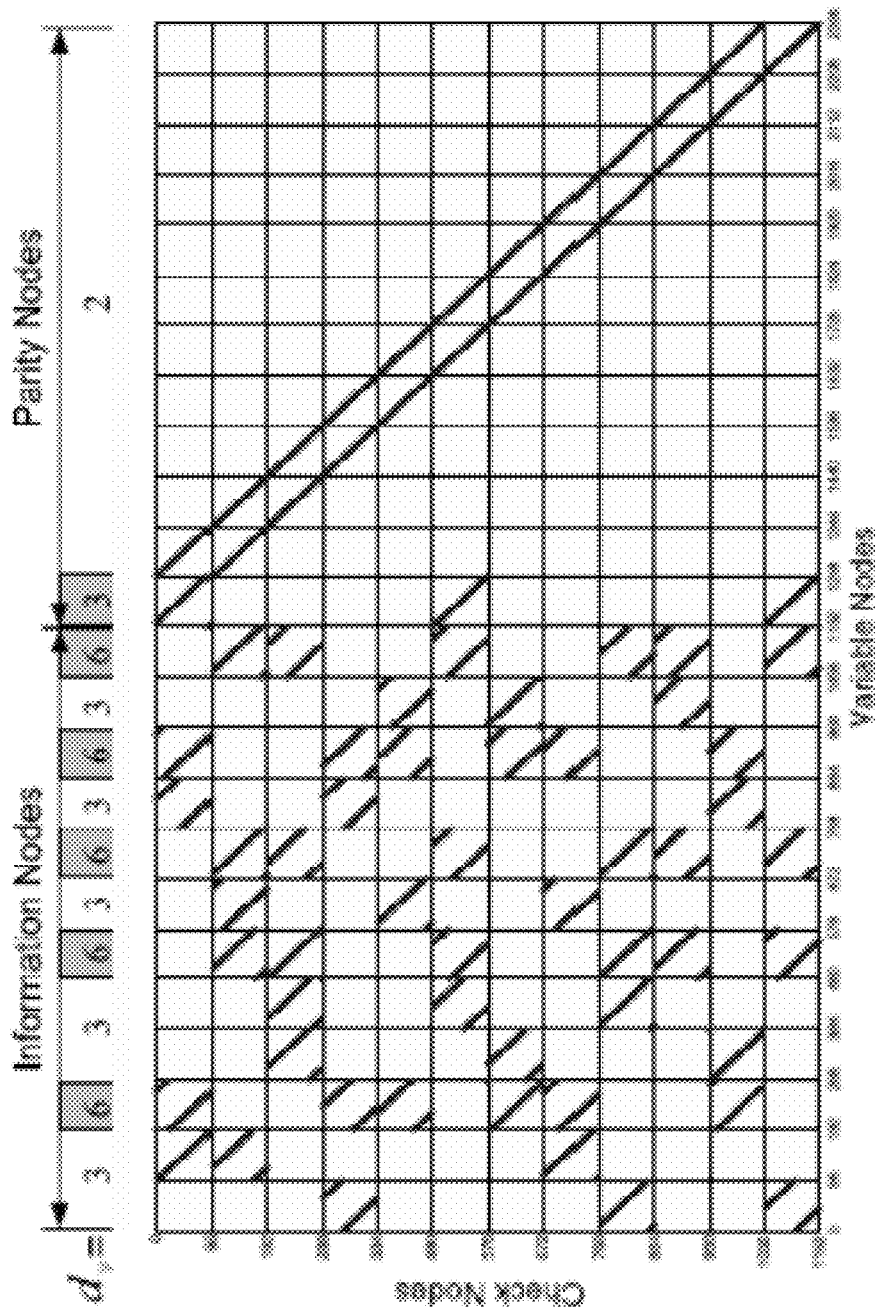
FIG. 4 depicts an example parity-check matrix H composed of circularly shifted identity sub-matrices.

The present disclosure relates to techniques used in LDPC encoding-decoding systems.

Aspects of this invention include methods and devices of generating a set of parity bits (p) from a set of information bits (s), by storing information related to z×z sub-matrices of a first sub-matrix and of a second sub-matrix corresponding to a first and a second portion of a parity check matrix H of an LDPC code, to allow representation of the parity check matrix in a compressed form and by generating the set of parity bits p by appropriately multiplying, shifting and accumulating subsets from the set of information bits s based on the stored information, without decompressing the parity check matrix.

Other aspects include the representation of the parity check matrix in a compressed form by iteratively constructing the parity check matrix by extending a base matrix. In another aspects of the invention methods and devices of decoding a codeword encoded with an LDPC code are proposed, by (i) storing a received set of k number of LLRs in a set of k number of memories, respectively, (ii) executing k number of parallel variable-to-check and check-to-variable message updating processes, until a decoding iteration is completed and (iii) repeating the executing step until a termination criterion is met.

In yet a third aspect, a shared memory implementation is described.

DETAILED DESCRIPTION

The word "exemplary" is used herein to mean "serving as an example, instance, or illustration." Any embodiment described herein as "exemplary" is not necessarily to be construed as preferred or advantageous over other embodiments.

In the present disclosure, the structural properties of the H matrix are exploited to address the above issues both in the encoder and the decoder.

The problem addressed is the design of reduced-complexity high-throughput forward error correction systems based on LDPC. Due to the need for very long codewords, these encoder-decoder systems require large amounts of hardware resources.

The codes are characterized by a sparse parity check matrix H. Decoding is feasible from the view of required hardware resources due to the use of iterative decoding algorithms.

However, decoder iterations reduce overall throughput, therefore efficient parallel decoder architectures are required, characterized by high utilization of processing elements. Regarding the encoder the main problem lies in the fact that, while the parity check matrix H is sparse, the corresponding generator G can be very dense, thus increasing the complexity of the encoder.

Encoding is not iterative and since it is necessarily performed by a set of vector-by-matrix multiplications in a Galois field, it can be parallelized.

The optimization goal is to avoid the complexity of operations with dense matrices, such as G, and compress the required information so that both required memory size and computations are minimized.

In the following paragraphs the technical solution associated with the Decoder will be described first followed by that for the Encoder.

Aspects of this invention include encoding and decoding techniques using LDPC codes, LDPC encoders and LDPC decoders.

In one aspect of the invention a method is proposed of generating a set of parity bits (p) from a set of information bits (s), comprises storing information related to z×z sub-matrices of a first sub-matrix and of a second sub-matrix corresponding to a first and a second portion of a parity check matrix H of an LDPC code, respectively, to allow representation of the parity check matrix in a compressed form and generating the set of parity bits p by appropriately multiplying, shifting and accumulating subsets from the set of information bits s based on the stored information, without decompressing the parity check matrix.

In another aspect of the invention the representation of the parity check matrix in a compressed form comprises iteratively constructing the parity check matrix by extending a base matrix.

In yet another aspect of the invention an encoding device is proposed for generating a set of parity bits (p) from a set of information bits (s), comprising (i) storing means for storing information related to z×z sub-matrices of a first sub-matrix and of a second sub-matrix corresponding to a first and a second portion of a parity check matrix (H) of an LDPC code, respectively, to allow representation of the H matrix in a compressed form and (ii) encoding means, for encoding the set of information bits s, without decompressing the parity check matrix.

In yet another aspect of the invention A method of decoding a codeword encoded with an LDPC code, comprising the steps of (i) storing a received set of k number of LLRs in a set of k number of memories, respectively, (ii) executing k number of parallel variable-to-check and check-to-variable message updating processes, until a decoding iteration is completed and (iii) repeating the executing step until a termination criterion is met.

In another aspect of the invention, a decoding device is proposed for decoding a codeword encoded with an LDPC code, comprising: (i) a set of k number of memories for storing a received set of k number of LLRs, respectively; and (ii) a set of k number of decoding units, each coupled to one of the set of k number of memories, respectively, for executing k number of parallel variable-to-check and check-to-variable message updating processes, until a decoding iteration is completed.

In yet another aspect, an LDPC encoder-decoder is proposed comprising (i) An encoding part for generating a set of parity bits (p) from a set of information bits (s); (ii) a decoding part for decoding an encoded codeword in parallel; and (iii) a memory, coupled to both the encoding part and the decoding part, wherein the memory is shareable by both the encoding and the decoding part and stores information related to z×z sub-matrices of a first sub-matrix and of a second sub-matrix corresponding to a first and a second portion of a parity check matrix (H) of an LDPC code, respectively, to allow representation of the H matrix in a compressed form.

Figure 6:
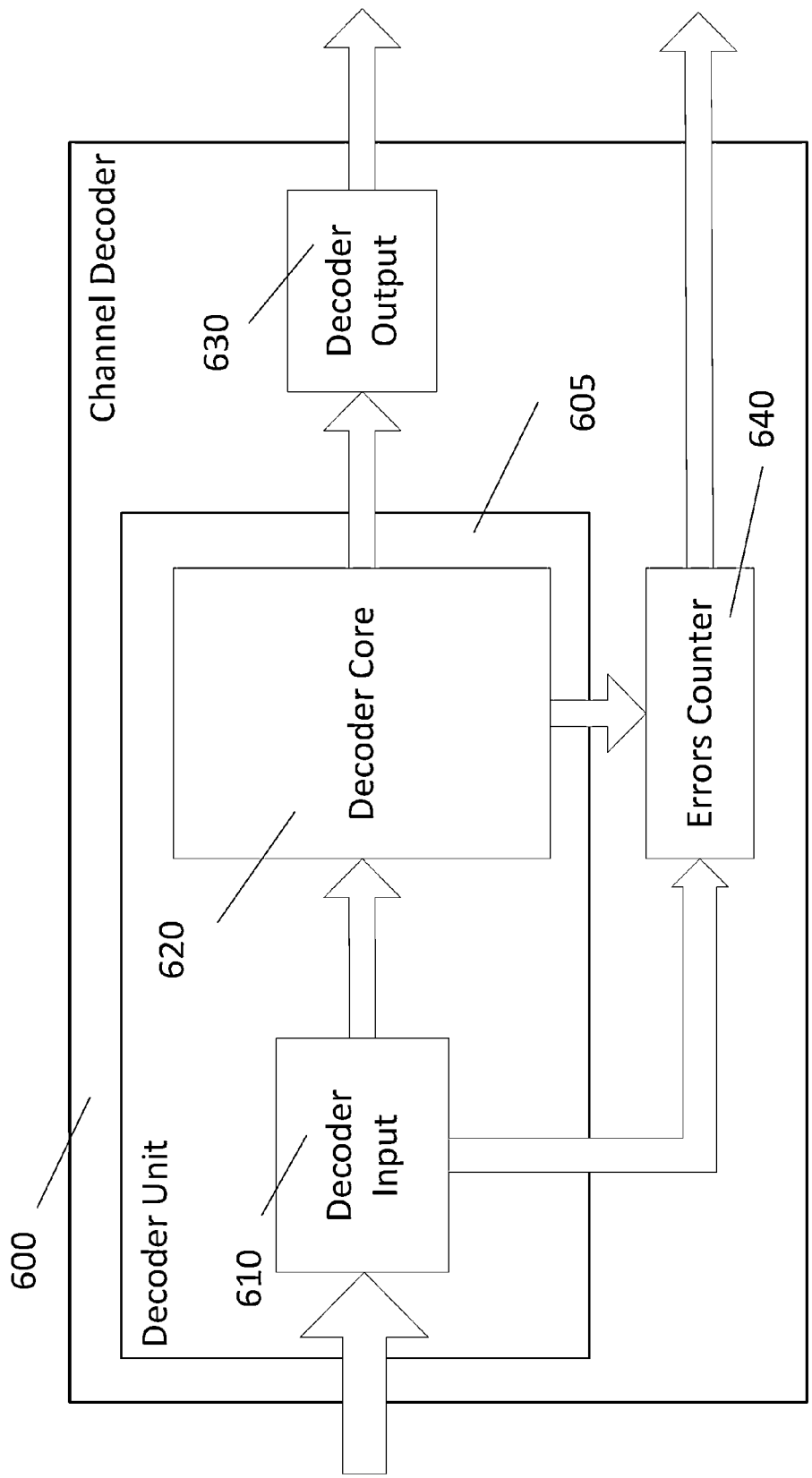
FIG. 6 shows Channel Decoder 600 (144), according to an exemplary embodiment.

FIG. 6 shows Channel Decoder 600 (144), according to an exemplary embodiment. Channel Decoder 600 includes Decoder Input 610, Decoder Core 620, Decoder Output 630, and Errors Counter 640. Decoder Input 610 receives channel reliability information in the form of groups of Log-Likelihood Ratio (LLR) per bit and rearranges it in groups of LLRs of a size suitable to be transmitted to the Decoder Core 620. Decoder Core 620 decodes LLRs provided by the Decoder Input 610, produces estimations of information bits and transmits them to Decoder Output 630 and Error Counter 640. Errors Counter 640 receives hard decisions (signs of LLRs) from Decoder Input 610 and information bit estimations from Decoder Core 620, compares them and produces as output the number of differences between its inputs. Decoder Output 630 receives from Decoder Core 620 the decoded information bits and rearranges them as required by subsequent stages.

The constituent components of the Channel Encoder are analyzed in the following paragraphs, where first the X-items-to-Y-items unit is described which is necessary for the proper I/O grouping that is required for the operation of Channel Encoder and Decoder I/O Subunits.

Figure 7:
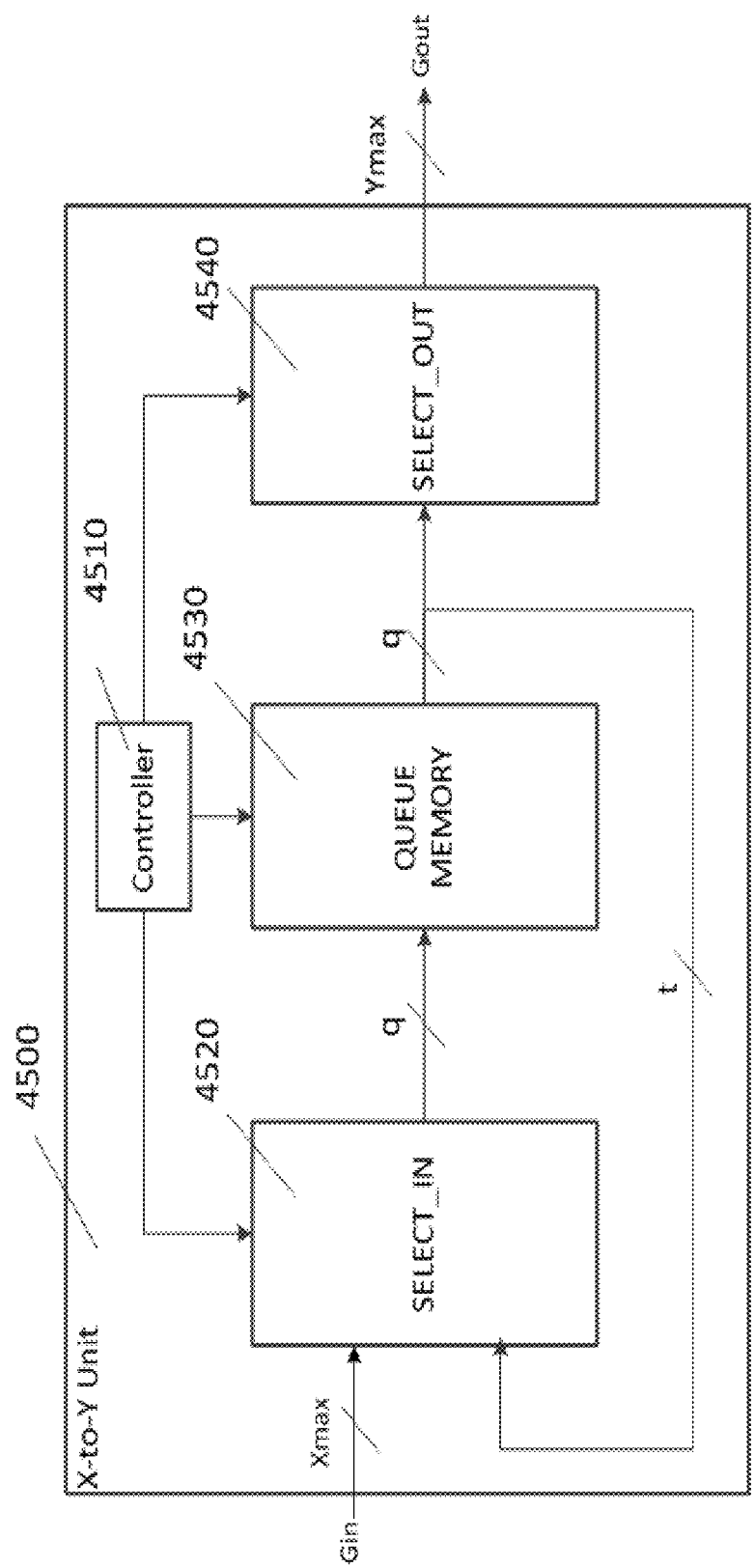
FIG. 7 depicts X-items-to-Y-items unit 4500, which receives as input a group Gin of X items, one group at a time and regroups them into group Gout of Y items.

FIG. 7 depicts X-items-to-Y-items unit 4500, which receives as input a group Gin of X items, one group at a time and regroups them into group Gout of Y items. Items can be either bits or LLRs. The number X of items in Gin is no more than Xmax, and the number of items in an output group Gout is no more than Ymax.

The number of items X or Y may be constant or change during operation. X-items-to-Y-items unit 4500 implements the algorithm of FIG. 6a and comprises SELECT_IN 4520, QUEUE MEMORY 4530, SELECT_OUT 4540, and Controller 4510.

QUEUE MEMORY 4530 stores the queue Q in registers, thus allowing simultaneous access to more than one elements. SELECT_IN receives Xmax items from the input and uses X of them, as dictated by the controller 4510. It concatenates them to t items received from QUEUE MEMORY 4530, which are the t least recently written to QUEUE MEMORY 4530, to form the new state which updates QUEUE MEMORY 4530. If there are at least Y items in the QUEUE MEMORY 4530, SELECT_OUT 4540 selects the Y least recently written in the queue and delivers them to the output.

Figure 8:
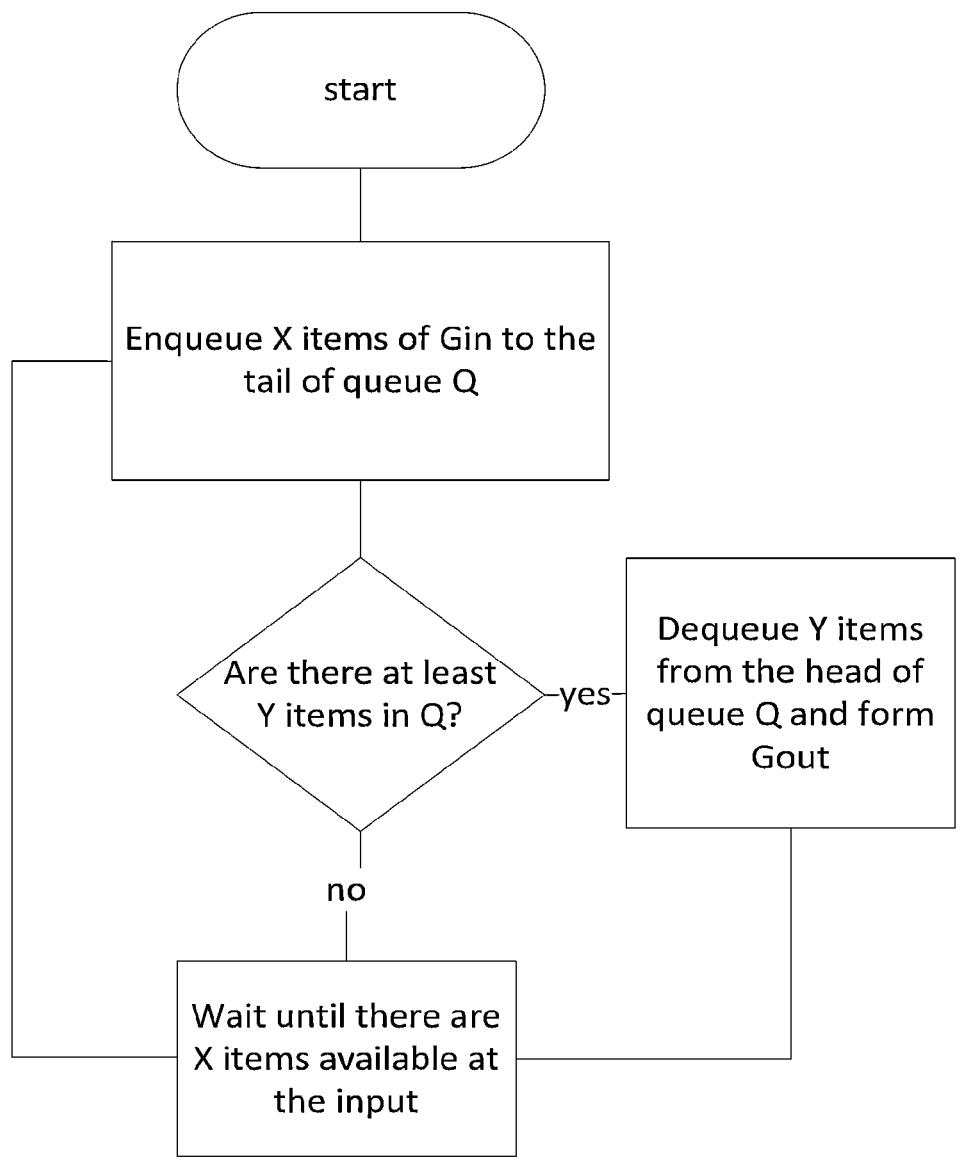
FIG. 8 depicts a flow diagram of the operation executed by X-items-to-Y-items unit 4500

When Y is less than Ymax, SELECT_OUT 4540 produces a constant predefined value for the Ymax-Y items, for example zero. Controller 4510 provides the required activation signals. A flow diagram of the operation executed by X-items-to-Y-items unit 4500 is depicted in FIG. 8.

Figure 9:
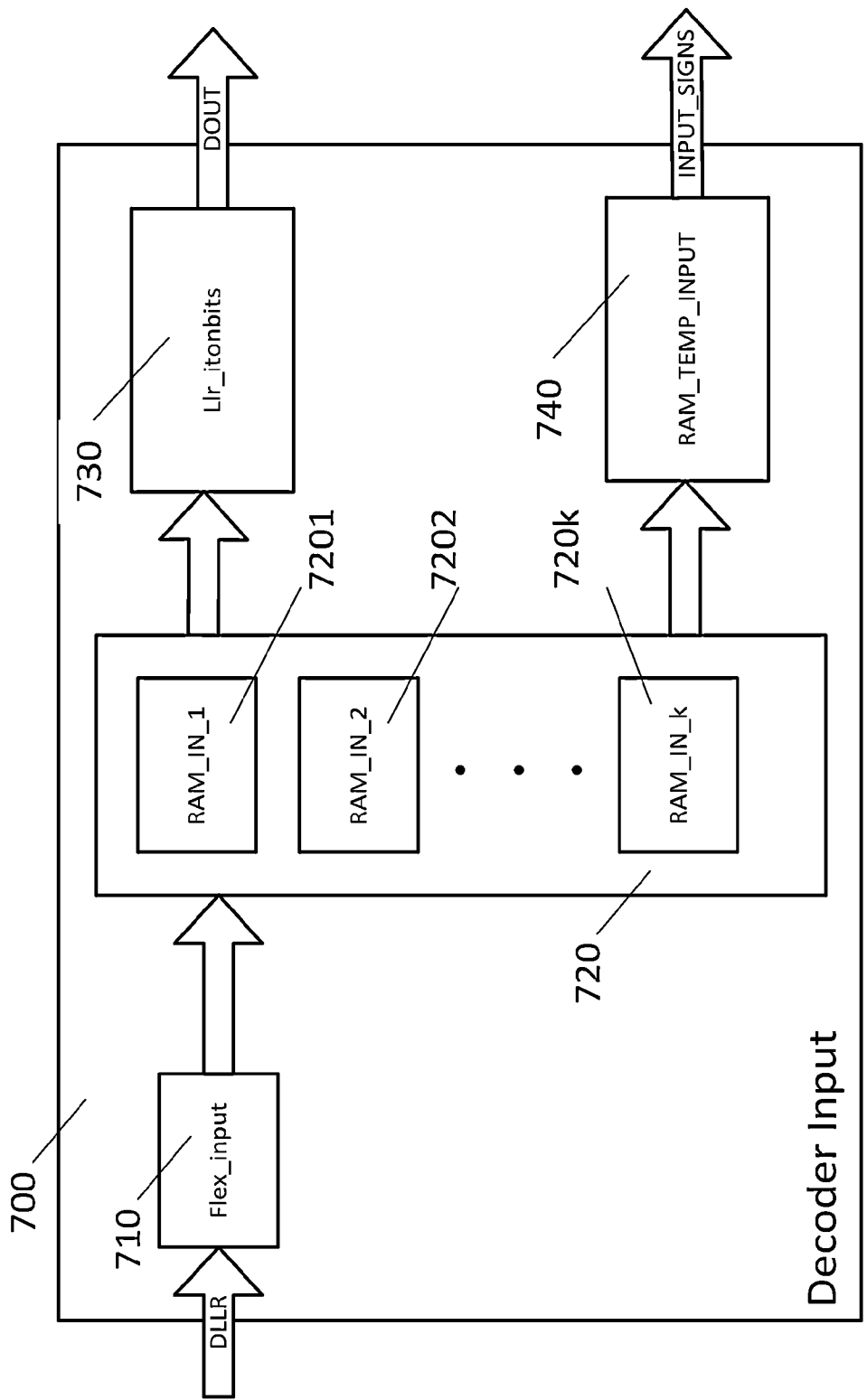
FIG. 9 depicts Decoder Input 700 (610).

FIG. 9 depicts Decoder Input 700 (610). Decoder Input 700 is composed of flex_input 710, memory 720, llr_itonbits 730, and ram_temp_input 740. Flex_input 710 receives reliability information DLLR from Demodulator (142) and stores it in the memory unit 720 which is composed of k independent memories. Llr_itonbits 730 receives LLRs from memory 720 and sign extends them to the wordlength required by the Decoder Core, to which it provides its outputs DOUT. Ram_temp_input 740 receives sign bits of LLRs from memory 720 and stores them, until they are required by the Errors Counter 640, to which it provides INPUT_SIGNS. Flex_input 710 performs three functions: it supports variable code rate, variable information word length and variable order of modulation.

Figure 10:
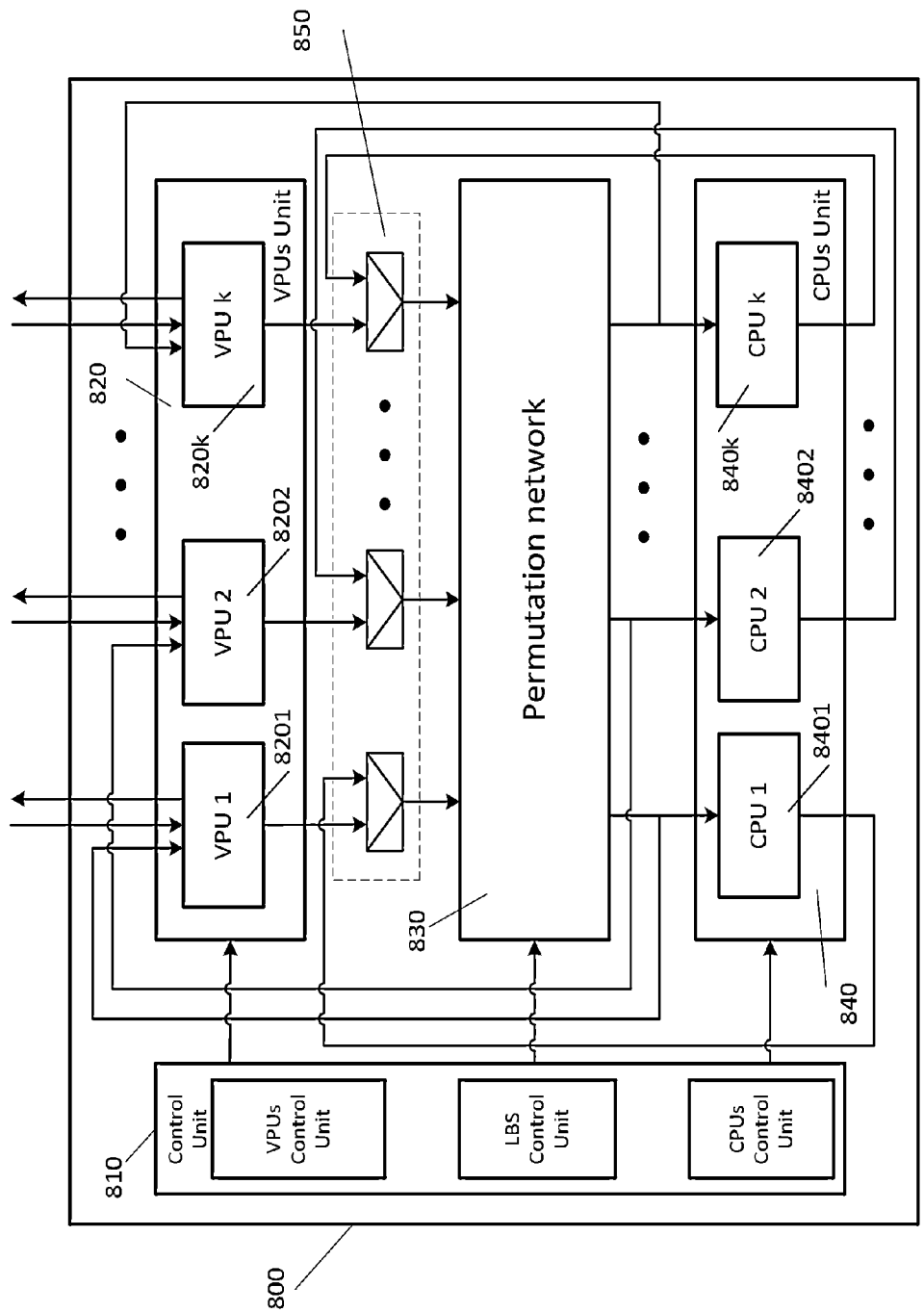
FIG. 10 depicts Decoder Core 800 (620), according to an exemplary embodiment.

FIG. 10 depicts Decoder Core 800 (620), according to an exemplary embodiment. Decoder Core 800 comprises Control Unit 810, VPUs Unit 820, Permutation Network 830, CPUs Unit 840, and MUX 850. Control Unit 810 provides control signals to VPUs Unit 820, Permutation Network 830 and CPUs Unit 840. VPUs Unit 820 comprise a set of VPUs which receive LLRs from Decoder Input and Permutation Network 830 and produce variable-to-check messages which are transmitted to the MUXes 850.

MUXes 850 receive variable-to-check messages from VPUs Unit 820 and check-to-variable messages from CPUs Unit 840 and transmit them to Permutation Network 830, the outputs of which are connected to both VPUs Unit 820 and CPUs Unit 840. Decoder Core 800 uses the Permutation Network 830 to implement both the transmission of variable-to-check messages from VPUs Unit 820 and the transmission of check-to-variable from CPUs Unit 840 to VPUs Unit 820.

Figure 11:
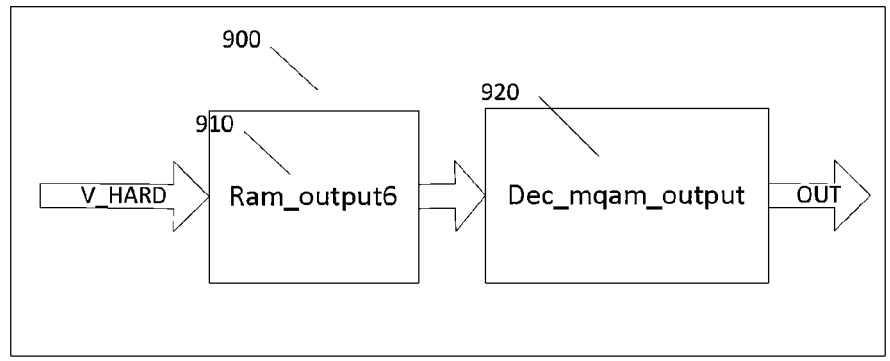
FIG. 11 depicts Decoder Output 900 (630).

FIG. 11 depicts Decoder Output 900 (630). Decoder Output 900 contains ram_output6 910 and dec_mqam_output 920. Decoder Output 900 receives decoded information bits V_HARD from Decoder Core. The information bits decoded by the Decoder Core are stored in ram_output6. Dec_mqam_output 920 reads data stored in ram_output6 910 and forms groups of bits of appropriate size which can be defined during operation. Dec_mqam_output 920 implements X-items-to-Y-items Unit 4500 for a constant number of decoded bits and produces decoded-bit groups of variable sizes. In the exemplary embodiment the size of input decoded-bit groups is 8, while the output group size varies from 2 to 8, defined during operation.

Figure 12:
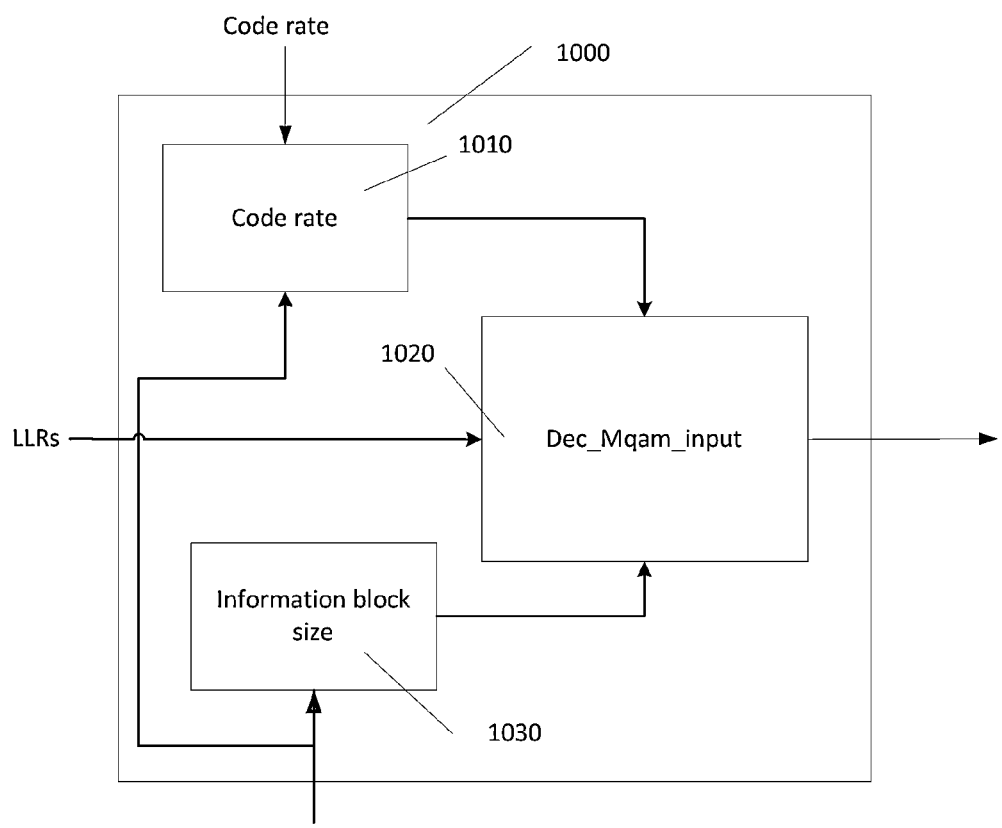
FIG. 12 depicts a functional diagram of flex_input 1000 (710).

FIG. 12 depicts a functional diagram of flex_input 1000 (710). It comprises three blocks, namely Information Block Size 1030, Code Rate 1010, and Dec_mqam_input 1020. Information Block Size 1030 inserts LLRs of maximum absolute value at locations corresponding to shortened bits. Code Rate 1010 inserts minimum reliability (LLR equal to zero) to locations corresponding to punctured bits. Dec_mqam_input 1020 receives input LLRs, and the outputs of Information Block Size 1010 and Code Rate 1020 and organizes them to LLR groups of size z, before they are stored in LLR memories. Dec_mqam_input 1020 implements X-items-to-Y-items unit 4500 for a variable size of input LLR groups defined during operation and generates groups of LLRs of constant size z. In the exemplary embodiment, the input group size spans the values 2, 3, . . . , 8, while the output is of constant size 8.

Figure 13:
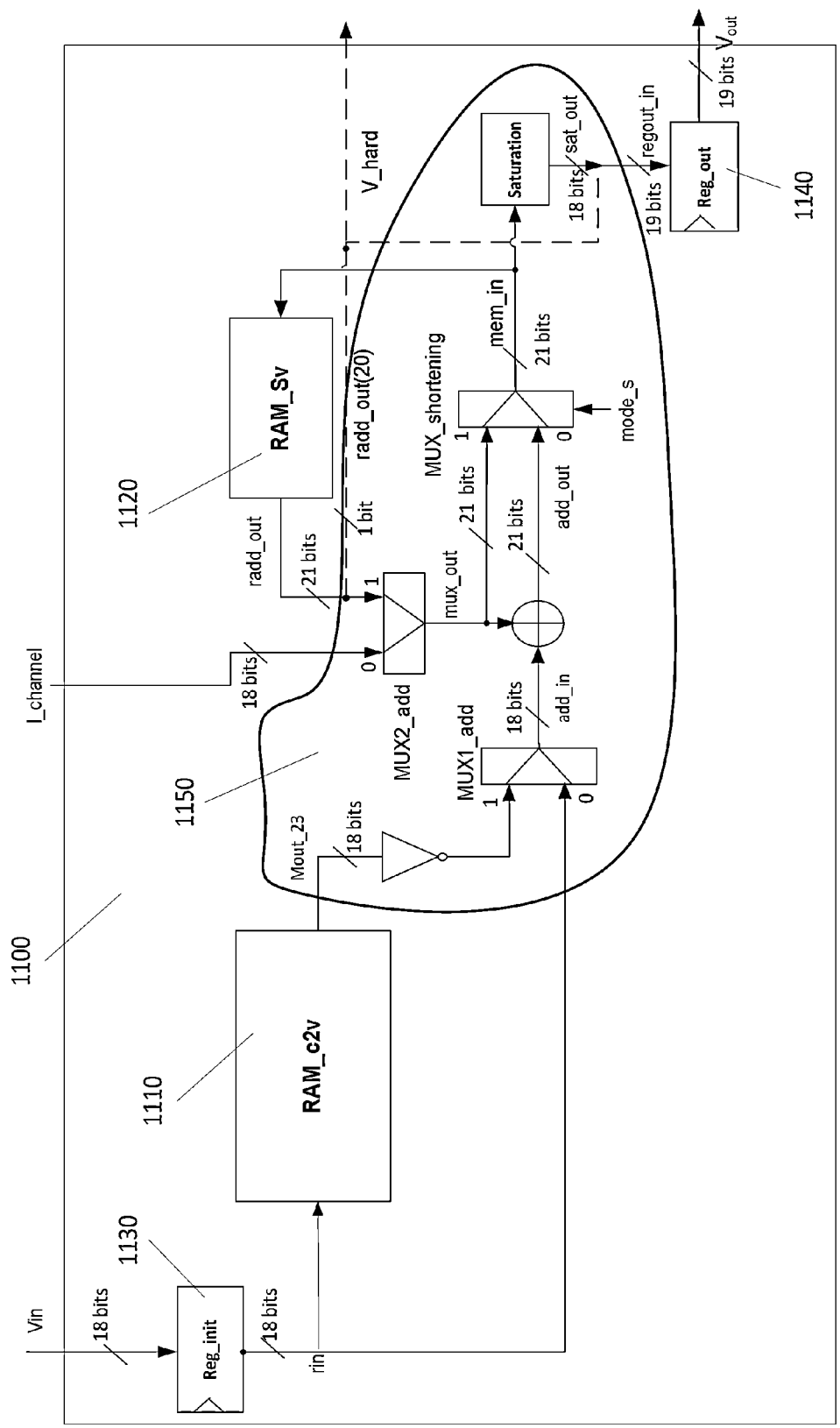
FIG. 13 depicts an implementation of one of the Variable Processing Units (VPU) 1100 contained in the VPUs Unit (820) of the Decoder core (800), according to an exemplary embodiment.

FIG. 13 depicts an implementation of one of the Variable Processing Units (VPU) 1100 contained in the VPUs Unit (820) of the Decoder core (800), according to an exemplary embodiment. Variable Processing Unit (VPU) 1100 comprises a RAM_c2v 1110, to store the messages from Check Nodes that are directed to the variable nodes implemented by VPU 1100, RAM_Sv 1120 which holds the current estimation for all bits that correspond to the variable nodes implemented by VPU 1100, Reg_init 1130 which holds the current input to VPU, Reg_out 1140 which holds the current output and logic 1150 which implements the processing of the VPU, namely the updating of the current estimation and the computation of variable-to-check messages.

The iterative construction that is used for the formation of the H matrix in Quasi-Cyclic LDPC codes allows a decoder to be organized in several parallel configurations, characterized by (i) a high utilization (100%) of the processing elements (check and variable processor nodes) avoiding memory conflicts and (ii) a simple and scalable interconnection network. Such cases are presented as exemplary embodiments in FIGS. 14, 15, and 16A-C.

Figure 14:
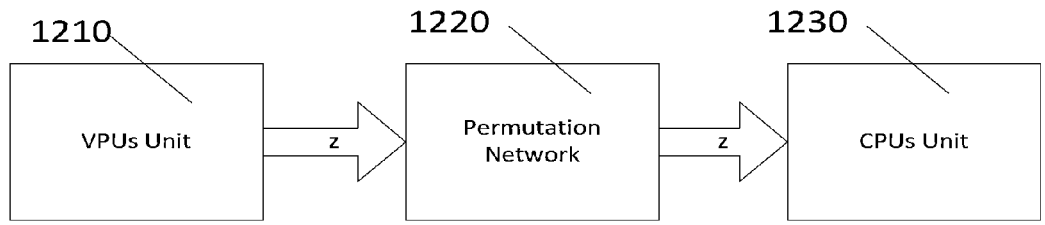
FIG. 14 depicts the principle of transmitting variable-to-check messages within a serial Decoder Core, for the case of a single-level extended parity check matrix, according to an exemplary embodiment.

FIG. 14 depicts the principle of transmitting variable-to-check messages within a serial Decoder Core, for the case of a single-level extended parity check matrix, according to an exemplary embodiment. VPUs UNIT 1210 transmits z messages in parallel through Permutation Network 1220, which shuffles them appropriately, so that they can be consumed by CPUs Unit 1230. The transmission of check-to-variable messages from CPUs UNIT to VPUs Unit is similar. Permutation network 1220 in this case comprises a Logarithmic Barrel Shifter (LBS).

Figure 15:
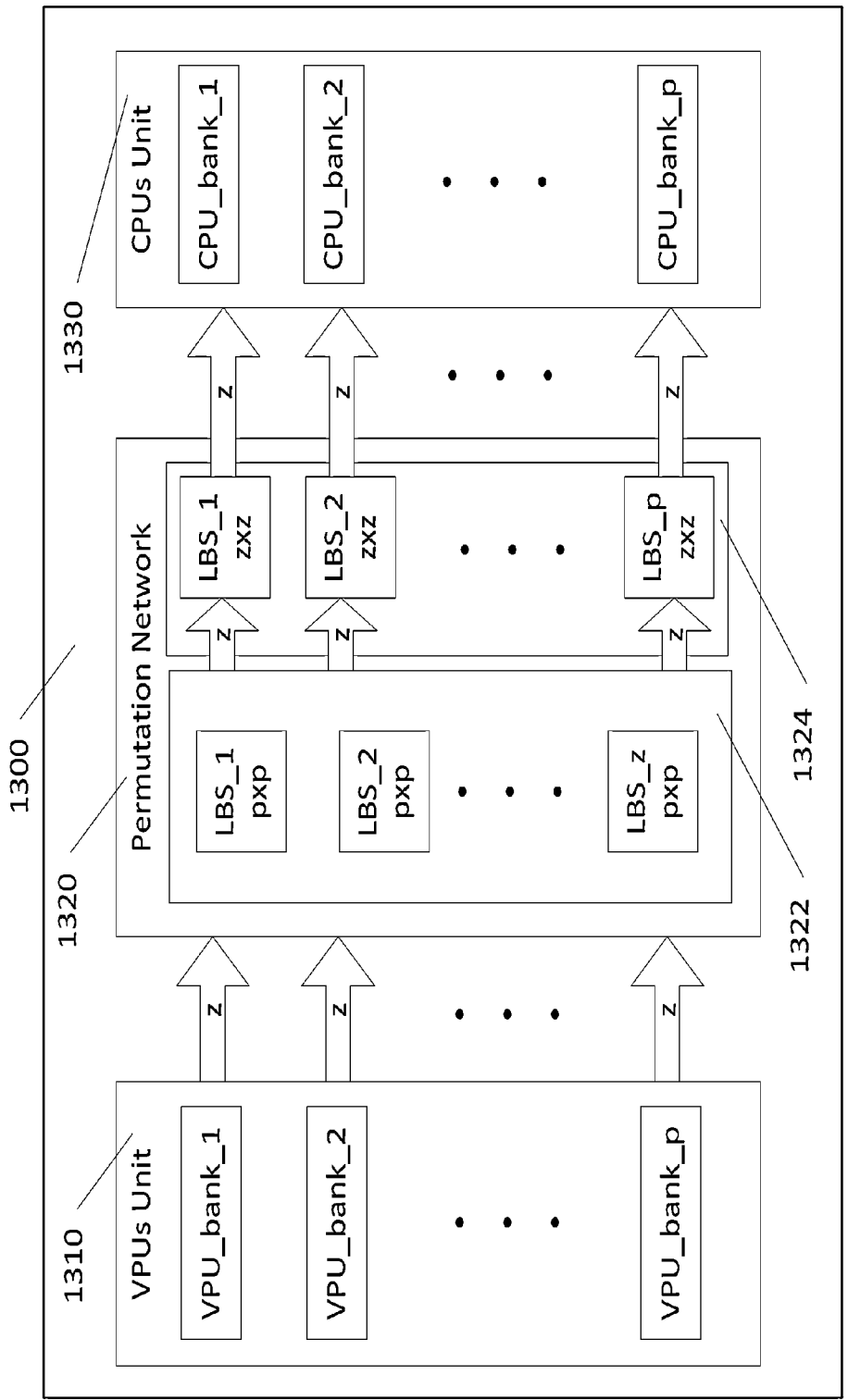
FIG. 15 depicts the transmission of variable-to-check messages from VPUs UNIT 1310 through a Permutation Network 1320 to the CPUs Unit 1330 for the case of a parallel Decoder Core 1300 (800).

FIG. 15 depicts the transmission of variable-to-check messages from VPUs UNIT 1310 through a Permutation Network 1320 to the CPUs Unit 1330 for the case of a parallel Decoder Core 1300 (800) stemming from a two-level extension of the parity check matrix, the first by g×g and the second by z×z matrices ($z_1$=g, $z_2$=z). In the particular case, VPUs Unit is composed of p independent banks VPU_bank_p each of z VPUs. Similarly CPUs Unit 1330 is composed of p CPU_bank_p of z CPUs. Permutation Network 1320 is composed of two levels of Logarithmic Barrel Shifters (LBS), the first-level 1322 comprising z LBSs of size p×p, while the second level 1324 comprises p LBS of size z×z.

Input x (x: 1 to p) of LBS_y (y: 1 to z) of the first-level 1322 is connected with the output y of VPU_bank_x.

Input y (y: 1 to z) of LBS_x (x: 1 to p) of the second-level 1324 is connected with the output x of LBS_y of the first-level 1322.

Input y (y: 1 to z) of VPU_bank_x (x: 1 to p) is connected with the output y of LBS_x of the second-level 1324.

This architecture is capable of processing in parallel k=z·p rows of H. The particular code construction method ensures that there is a unique '1' element in every column of these sub-matrices, allowing the parallel processing of up to z·g lines without data conflicts. Due to the iterative construction of H, the number p of banks can be selected to be any multiple of factors to which value g is factorized (e.g. for g=21=3·7, p can assume the values p=3, 7 or 21), allowing memory-conflict free, fully parallel operation without any impact on memory cost. Therefore p can serve as a design parameter that allows the exploration of the decoder design space.

Larger values of p (e.g. p=21) produce highly parallel decoder architectures, hence larger and faster, while smaller values of p (e.g. p=3) lead to less hardware demanding decoder architectures, at the cost of throughput reduction.

Accordingly, an H matrix constructed in r iterations allows for implementations with r levels of parallelism. The employed interconnection network is highly scalable to support multiple levels of extension. There are k RAM_IN_x and RAM_Sv memories of N/k locations each, and k RAM_c2v memories of max(du)·(N/k) locations, where N is the length of the codeword and k is the parallelization factor of the particular decoder architecture. Each extension of the base matrix multiplies the number of VPU units by a factor $z_r$, and divides the size of the overall distributed memory of every VPU and the size of every RAM_IN_x input memory by the same factor. Consequently, the overall memory of the decoding circuit remains constant.

This results in an increased throughput by a factor k, much higher than the increase of the decoder's hardware complexity, where k≤$z_1 \cdot z_2 \cdot \ldots \cdot z_r$. The hardware complexity and flexibility of the decoder depends on the structure of the parity check matrix. The iterative construction of H matrix allows the decoder to implement different levels of parallelism. Assume that the H matrix is constructed in two steps.

For a given L×K base matrix $H_b$, the first step of the matrix extension uses sub-matrices of size $z_1 \times z_1$, and the second step uses sub-matrices of size $z_2 \times z_2$.

The M×N matrix H consists of M/($z_2 \cdot z_2$) sub-matrices, or layers, of size ($z_2 \cdot z_2$)×N.

As an example, consider the construction of a rate-¾ QC-LDPC code with codeword length N=2016 and two levels of extension, using $z_1$=21 and $z_2$=4. Consequently, the size of the obtained parity check matrix is 504×2016.

The iterative construction method uses a 6×24 core base matrix (FIG. 17(a)).

The first step of the extension, for $z_1$=21 (FIG. 17(b)), produces a 126×504 matrix.

The second extension step, using $z_2$=4 (FIG. 17(c)), produces the 504×2016 QC-LDPC matrix, which consists of six 84×2016 sub-matrices.

The corresponding decoder architecture is capable of processing in parallel up to $z_1 \cdot z_2$=84 rows of H, accelerating decoding by a factor k.

Figure 16A:
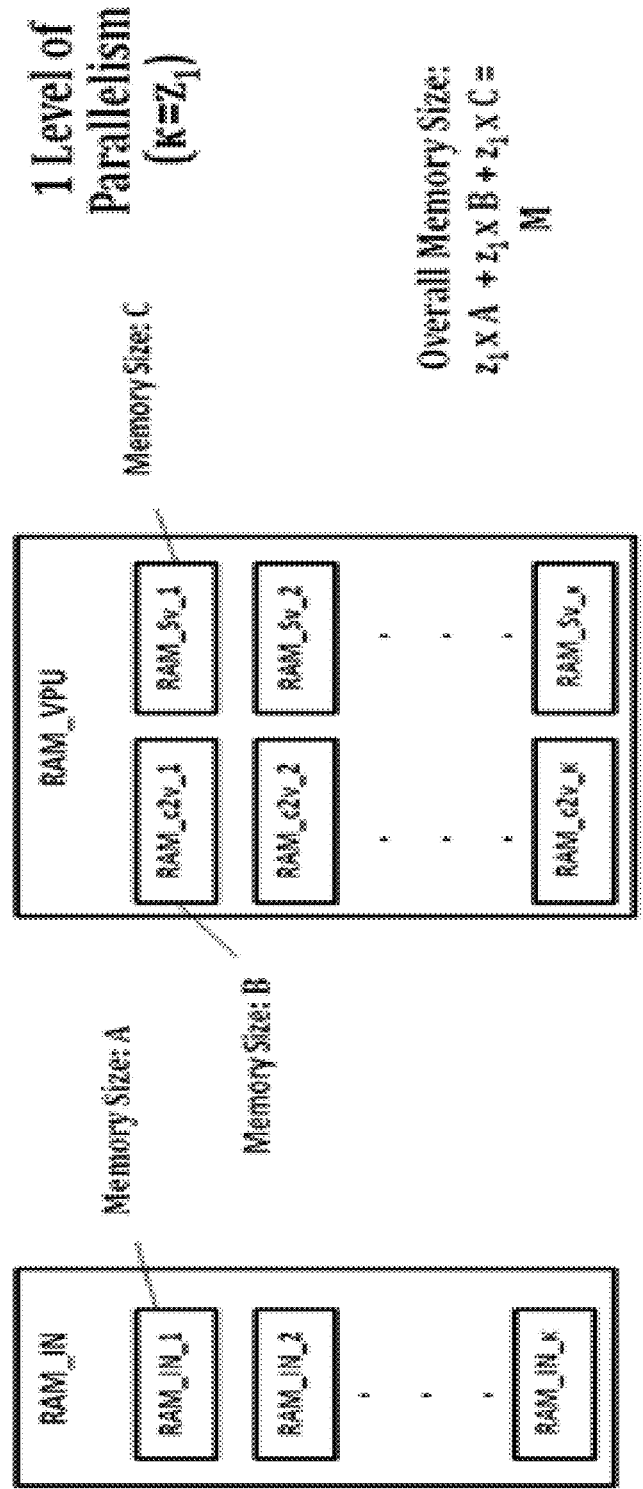
FIG. 16A-C depicts a part of the memory organization of Channel Decoder 600 as a function of the degree of parallelism exploited.
Figure 16B:
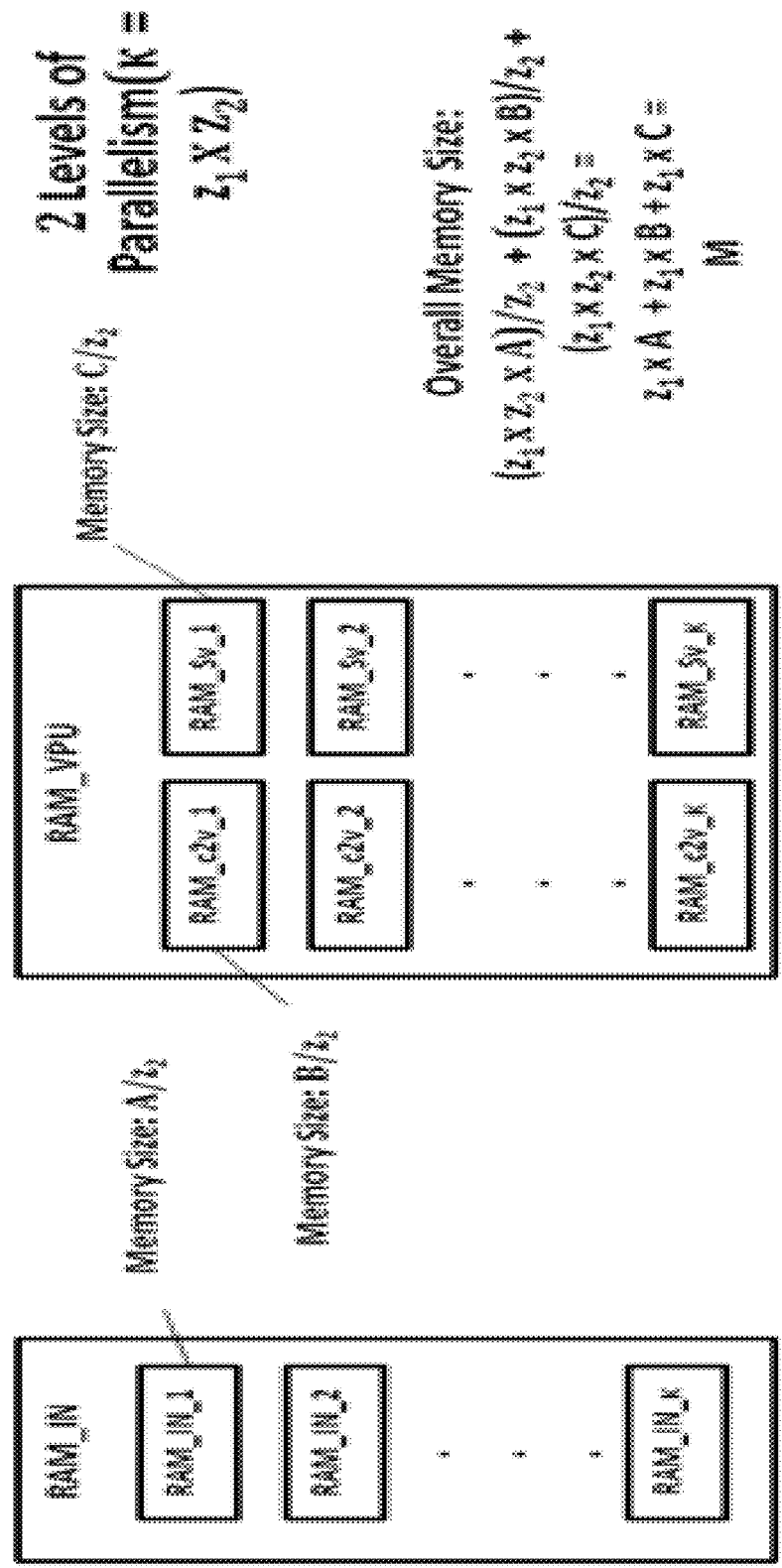
Figure 16C:
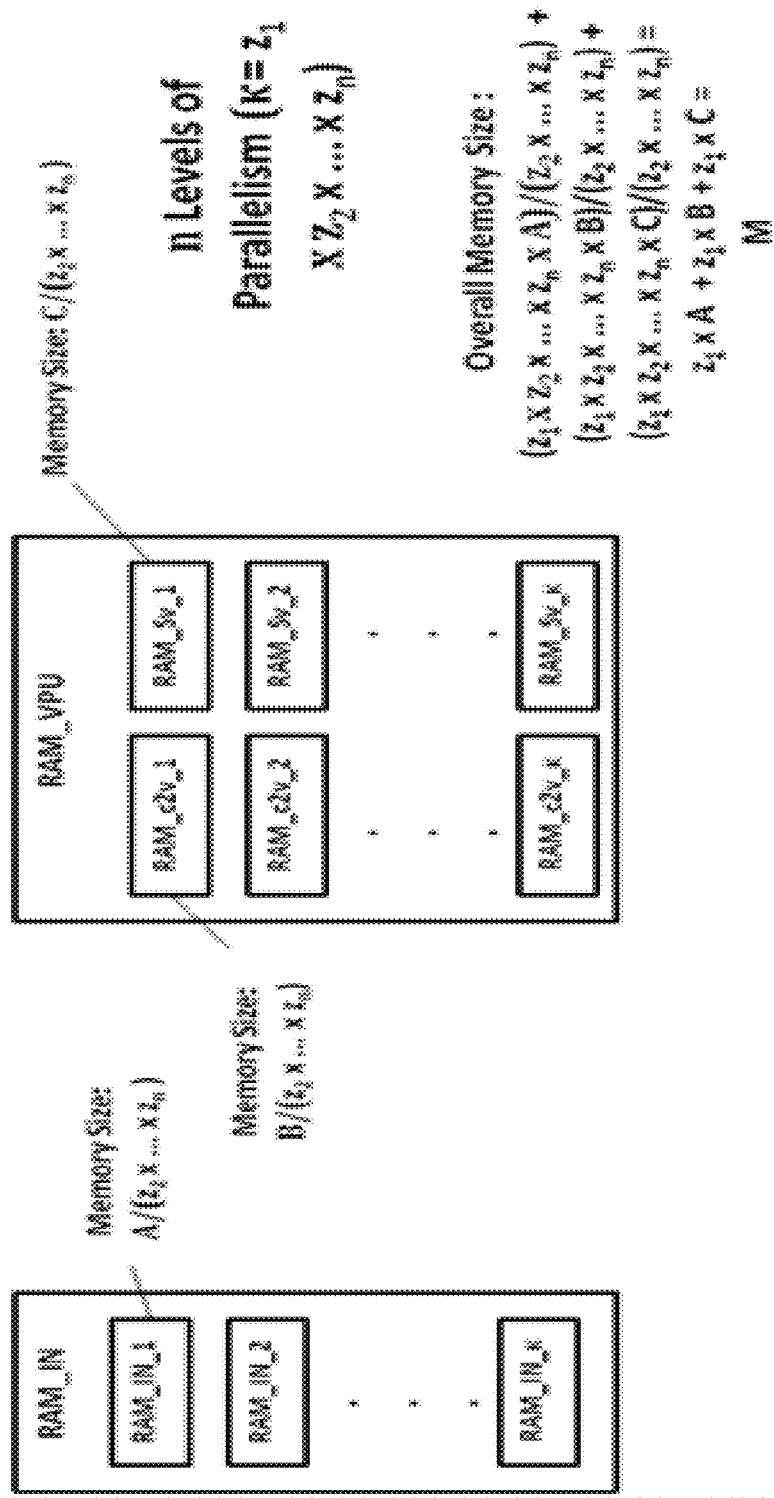

FIG. 16A-16C depict a part of the memory organization of Decoder Unit 605 as a function of the degree of parallelism used. Specifically, three cases are shown, namely the case of one-level of parallelism where k=z1 VPUs and CPUs are used, the case of two-level parallelism where k=z1×z2 VPUs and CPUs are used, and the general case of n-level parallelism where the number of VPUS and CPUs employed is k=z1×z2×...×zn. RAM_IN 720, physically located at Decoder Input 700, stores input DLLRs and is partitioned in k independent blocks. RAM_VPU contains memories that store check-to-variable messages (RAM_c2v_i, i=1, 2, ..., k) 1110 and current estimations (RAM_Sv_i, i=1, 2, ..., k) 1120 for the codeword bits. Each of the k VPUs 1100 contains a pair of memories 1110 and 1120. Therefore RAM_VPU is physically distributed in the k VPUs.

By exploiting the iterative construction of the parity check matrix, it is possible to support multiple degrees of parallelism without memory conflicts and without increasing the overall memory requirements. Furthermore, the overall size and general organization of the memory remains constant and independent of the degree of parallelism employed. As a consequence as the degree of parallelism increases, the number of the various memories increases, however the size of each memory decreases accordingly.

Figure 17:
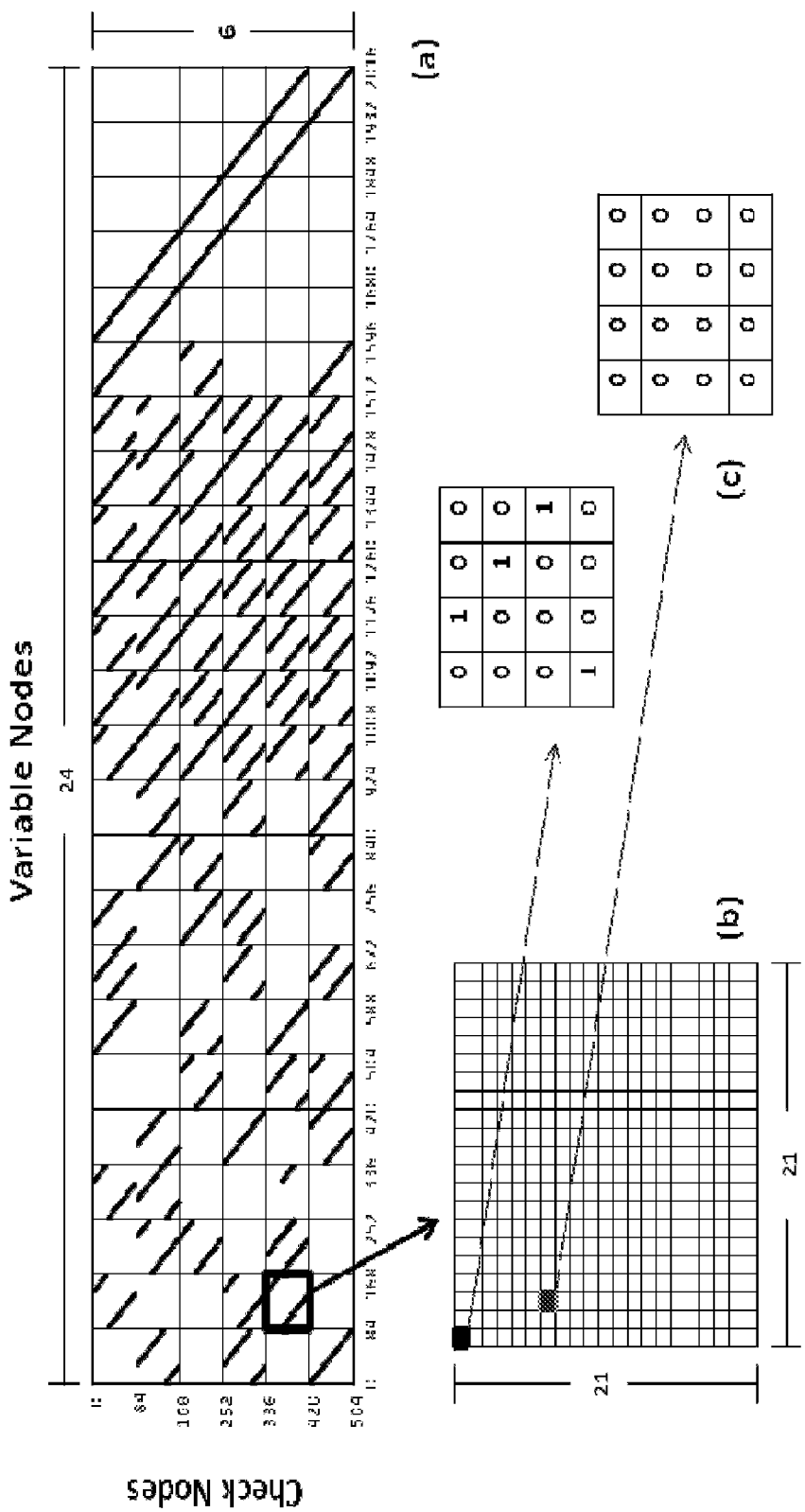
FIG. 17 depicts as an example the two-level extension of a base matrix by sub-matrices of different size.

FIG. 17 depicts as an example the two-level extension of a base matrix by sub-matrices of different size.

Figure 18:
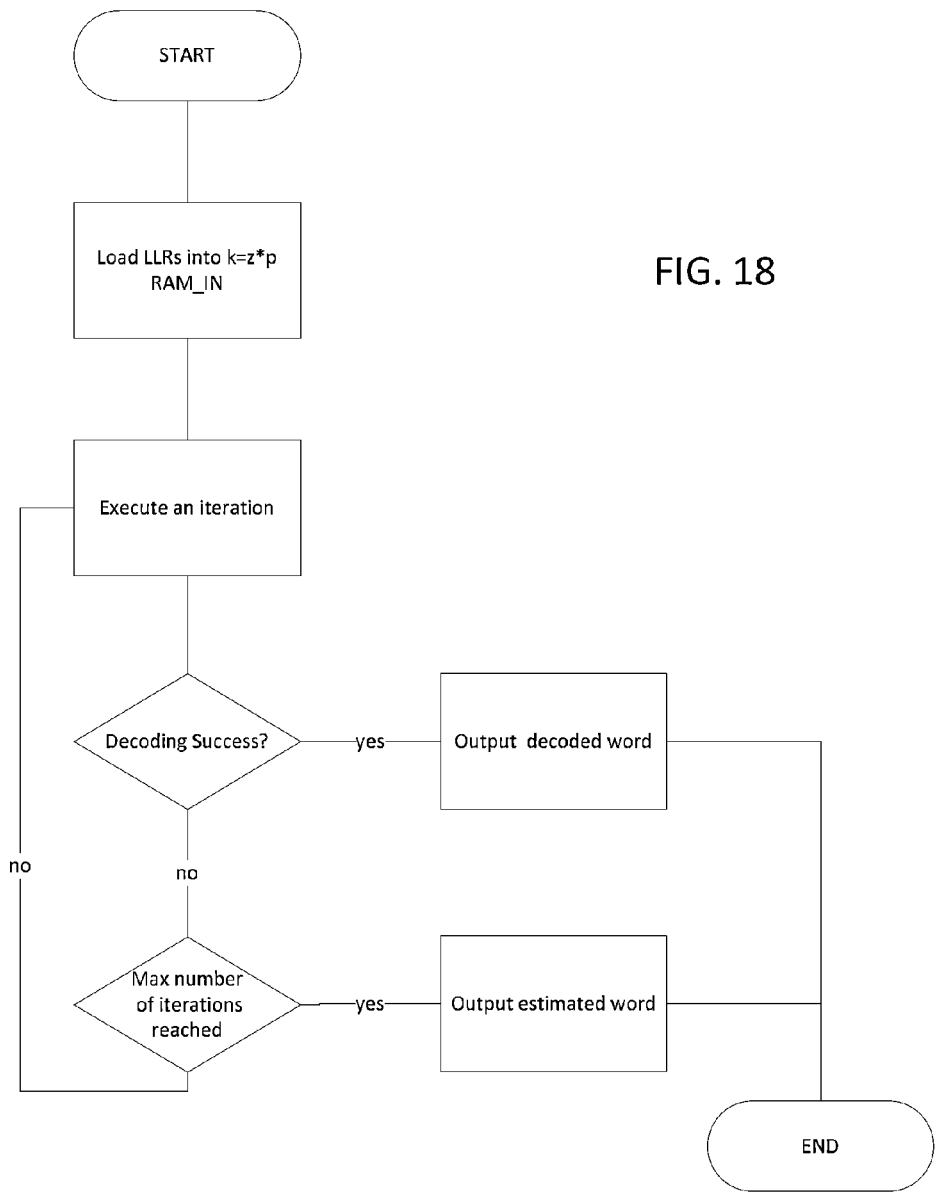
FIG. 18 depicts a top-level description of the operations performed by the Channel Decoder 600.

FIG. 18 depicts a top-level description of the operations performed by the Channel Decoder 600. Initially channel reliability information in the form of LLRs is loaded into the k RAM_IN memories 7201, 7202, ..., 720k. Subsequently the Channel Decoder executes decoding iterations until decoding success is achieved or a predefined maximum number of iterations is reached. In the case of decoding success, the decoded word is output. Otherwise, the estimation achieved in the last decoding iteration is used to produce a word which is output.

Figure 19:
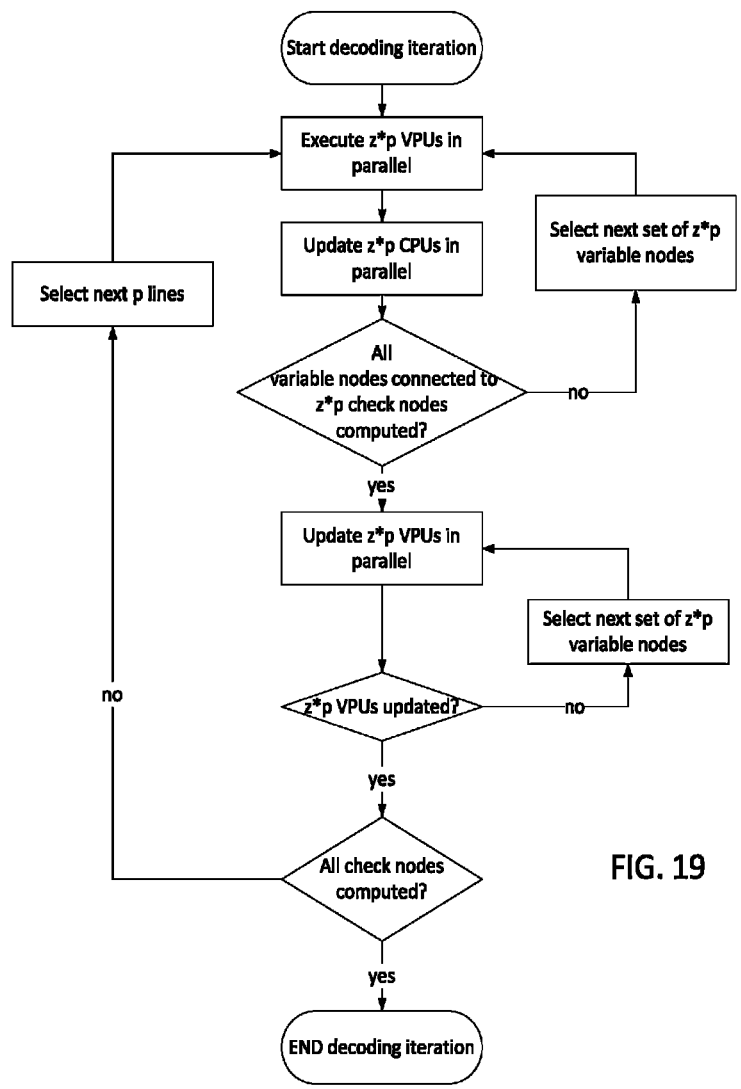
FIG. 19 depicts the operations executed by the Decoder Core 800, in each decoding iteration.

FIG. 19 depicts the operations executed by the Decoder Core 800, in each decoding iteration. Depending on the degree k=z*p of parallelism implemented in a particular Decoder Core embodiment, p lines of the parity check matrix, shown for example in FIG. 13b, are processed in parallel. The computation of each of the p lines is executed by z VPUs, thus utilizing the z*p VPUs and z*p CPUs, organized into p VPU_banks contained in VPU Unit 1310 and p CPU_banks, contained in CPU Unit 1330. The p VPU_banks are executed in parallel and compute and send variable-to-check messages to the p CPU_banks.

This operation continues until all variable nodes connected to the particular check nodes are executed and therefore the updating of the corresponding CPUs is completed. Then the particular variable nodes are updated using the information computed at the CPUs. Following the update of the VPUs, the algorithm proceeds to the next p lines and repeats the computation. The procedure concludes when all lines of the parity check matrix have been processed.

Clearly as p increases, less steps are required in order to complete an iteration, at the cost of implementing more VPUs and CPUs. However, the overall memory size remains constant and is independent of the degree of parallelism.

As mentioned, the main technical problem in the encoder case is the complexity of operations with dense matrices, such as G, that are required for its execution, whereas a technical solution for which could be formed by efficiently compressing the required information so that both required memory size and computations are minimized.

Towards this goal a technique is proposed of compressing the H matrix in order to minimize the required memory to store it while keeping the computational requirement for translating the compressed information to a low level.

The proposed technique starts with Equation 2. Now each codeword $c_i$ in Equation 2 corresponds to a vector in the form:

$$c = [s\ P] \quad \text{(Equation 3)}$$

where s is the vector of the information bits and p the vector of the parity bits.

If the code is systematic then H can be divided in two sub-matrices $H_1$ and $H_2$ such that:

$$H = [H_1 H_2] \quad \text{(Equation 4)}$$

Therefore the solution of Equation 2 to find the parity bits is as follows:

$$[sp] \times [H_1 H_2]^T = 0 \rightarrow$$

$$[sp] \times [{}_{H_2}{}^{H_1}]^T = 0 \rightarrow$$

$$sH_1^T + pH_2^T = 0 \rightarrow$$

$$p = sH_1^T \times (H_2^T)^{-1} \quad \text{(Equation 5)}$$

The multiplication in Eq. 5 can be executed in two steps:

$$p_1 = sH_1^T \quad \text{(Equation 6)}$$

$$p = p_1 \times (H_2^T)^{-1} \quad \text{(Equation 7)}$$

where Eq. 7 provides the parity bits.

With the above encoding method a linear encoder may be constructed with a complexity proportional to the length of the codeword.

An encoder, according to the invention, may pre-process the storage of the above sub-matrices $H_1^T$ and $(H_2^T)^{-1}$ and compress their elements without loss of any information required during encoding.

As mentioned, the H matrix is composed of circularly shifted identity sub-matrices. Consequently $H_1$ is also composed of circularly shifted identity sub-matrices. Therefore, only the location and shift value per z×z sub-matrix are required to be stored. The particular concept can be applied iteratively to further reduce memory required for the storage of location information of the sub-matrices. Specifically, the location information is represented as a base matrix, which is composed of z'×z' circularly shifted sub-matrices (and zero matrices), similarly to H matrix.

In a similar manner $(H_2^T)^{-1}$ can be compressed. $(H_2^T)^{-1}$ is not a sub-matrix of H but it is the inverse of the transpose of a square sub-matrix of H. However, it is composed of circulant z×z sub-matrices, other than identity matrices. While $H_1$ is composed of identity and zero matrix types only, several types of matrices compose $(H_2^T)^{-1}$. The matrix types that compose $(H_2^T)^{-1}$ appear circularly shifted. We exploit this property of the z×z sub-matrices that compose $(H_2^T)^{-1}$ to compress storage for $(H_2^T)^{-1}$ in the following way:

1. By an exhaustive search, we identify the number of component sub-matrices,
2. During searching, each sub-matrix is assigned a tag that uniquely characterizes its type. Also its location and the corresponding shift value are noted.
3. All triplets (type, location, shift), one per sub-matrix, are the information required to be stored for $(H_2^T)^{-1}$.

It is noted that an identical procedure can be followed for any factorization of $(H_2^T)^{-1}$, say $(H_2^T)^{-1} = A \cdot B$, adopted with the objective to further reduce computational complexity by reducing the number of operations with z×z sub-matrices. In such a case, parity bits due to Equation 7 are computed as $p = p_1 \times AB$, and each of the matrices A and B can be compressed using the method described to compress $(H_2^T)^{-1}$. Such a matrix factorization can be obtained using for example, LU decomposition.

From the design perspective, the compressed forms of $H_1$ and $(H_2^T)^{-1}$ can be directly used for the computation of the parity bits. Depending on the number of circulant sub-matrix types, and by exploiting the circulant organization, two hardware architecture solutions can be used: (i) Use of a mapper: employs a look-up table which receives the type tag from memory and returns the first row of the corresponding circulant sub-matrix to be used in the vector-matrix computation unit. (ii) Direct: no use of a mapper, rather the first row of each sub-matrix is used as the type tag.

The second choice is found to be preferable for small z (expansion factor); i.e., z=4, while the former is preferable for larger values of z.

The multiplication shown in Equations 6 and 7 is realized using shifting, and can be performed using a Logarithmic Barrel Shifter (LBS). In each clock cycle there is a parallel multiplication of z bits from s and p1.

Figure 20:
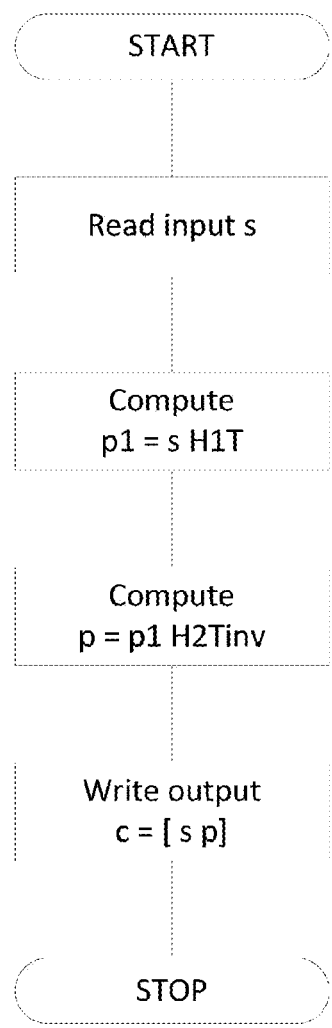
FIG. 20 depicts a flow diagram of an encoding algorithm, according to an exemplary embodiment.

FIG. 20 depicts a flow diagram of an encoding algorithm, according to an exemplary embodiment. Initially information bits s are read. Subsequently the intermediate result p1 is computed as described by Equation 6, i.e., the multiplication of s by the matrix H1T. The final result p is computed as described by Equation 7, i.e., the multiplication of p1 by H2Tinv.

Figure 21:
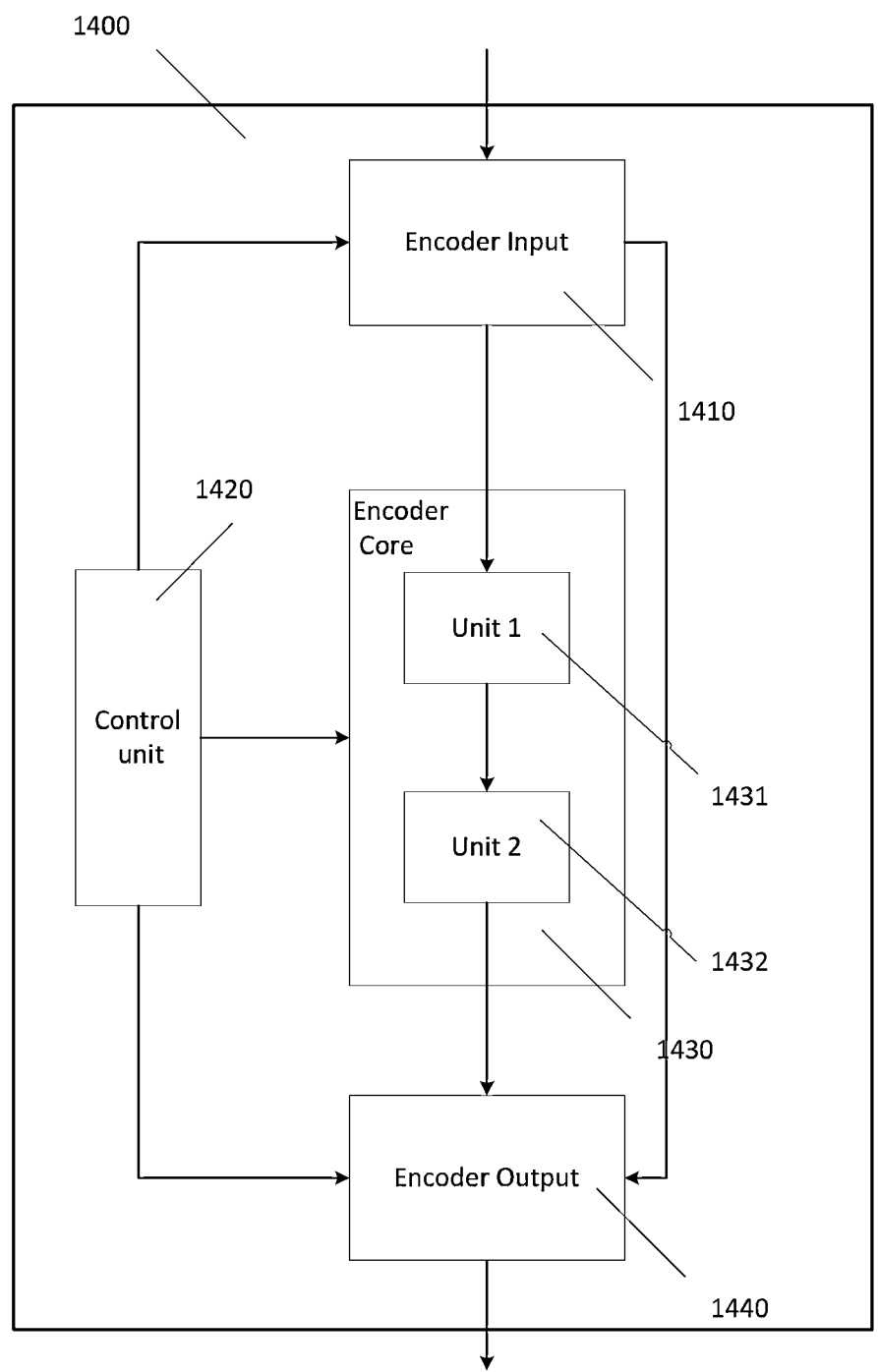
FIG. 21 depicts a top level diagram of Channel Encoder 1400 (124), according to an exemplary embodiment.

In the following paragraphs Channel Encoder embodiments and their variants that are in accordance with the aforementioned approach are described and analyzed FIG. 21 depicts a top level diagram of Channel Encoder 1400 (124), according to an exemplary embodiment. Channel Encoder 1400 consists of Encoder Input 1410, Control unit 1420, Encoder Core 1430 and Encoder Output 1440. Encoder Input 1410 receives groups of information bits and reorganizes them into groups of size suitable for processing by Encoder Core 1430. Encoder Core 1430 receives information bits groups of proper size from input unit 1410 and produces groups of parity bits, which are provided as inputs to Encoder Output 1440. A possible embodiment of Encoder Core 1430 comprises Unit_1 1431 and Unit_2 1432. Encoder Output 1440 combines the information bits provided by input unit and the parity bits computed by Encoder Core 1430 into groups of code word bits which are the outputs of the Channel Encoder 1400.

Figure 22:
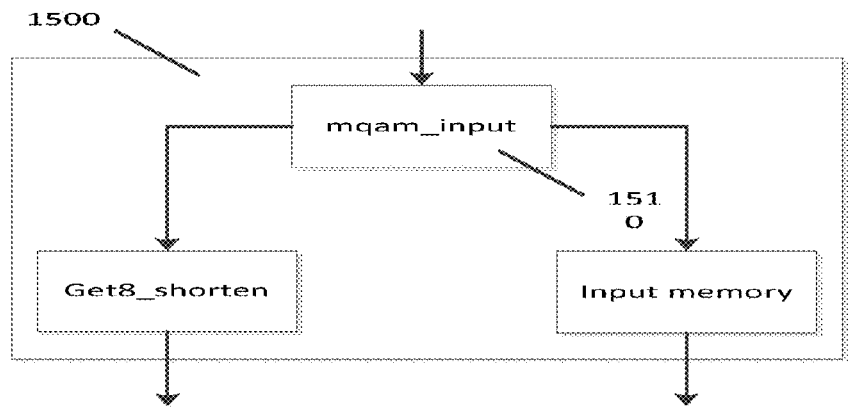
FIG. 22 depicts Encoder Input 1500 (1410).

FIG. 22 depicts Encoder Input 1500 (1410). Encoder Input 1500 comprises mqam_input 1510, get8_shorten 1530, and input memory 1520. Mqam_input 1510 receives information bits in groups of size defined by the order of the modulation scheme used and rearrange them to groups of size appropriate for processing by the Encoder Core 1430. Mqam_input implements X-items-to-Y-items unit 4500 for a variable X, X=2, 3 . . . , 8, and constant Y=Ymax=2*z. The output of mqam_input 1510 is stored in input memory 1520, before it is forwarded to Encoder Output 1440. The output of mqam_input also enters get8_shorten 1530 which either forwards it to the encoder core 1430 or forwards zeros to Encoder Core 1430, depending on the shortening scheme implemented.

Figure 23:
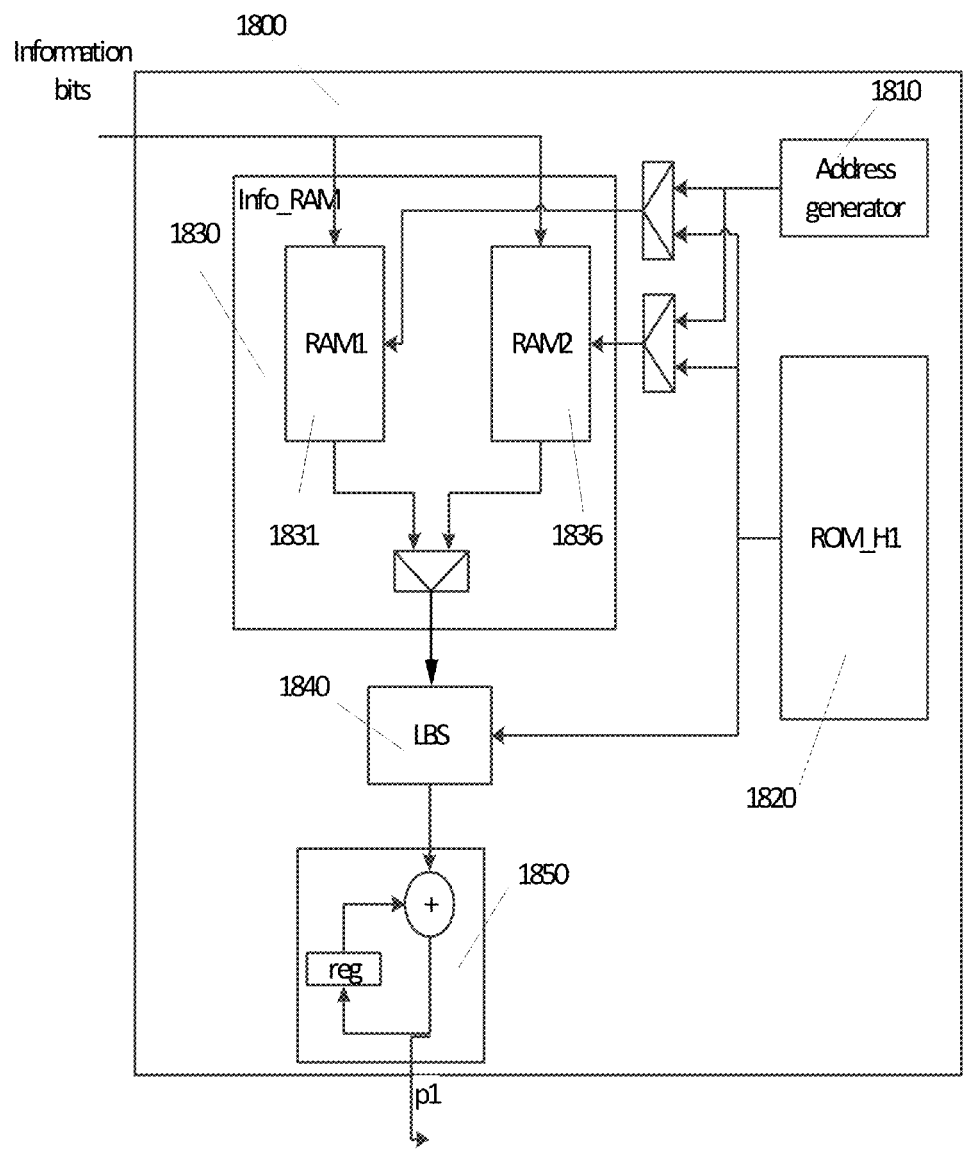
FIG. 23 depicts an embodiment of Unit_1 1800 (1431).

FIG. 23 depicts an embodiment of Unit_1 1800 (1431). Unit_1 1800 multiplies its input with matrix H1t. Unit_1 is composed of Address Generator 1810, ROM_H1 1820, Info_RAM 1830, LBS 1840, accumulator 1850. Information bits organized into groups of appropriate size, enter Unit_1 and are stored in Info_RAM 1830 at memory locations produced by Address Generator 1810. A possible embodiment of Info_RAM comprises two smaller memories 1831 and 1836.

The particular organization of Info_RAM allows to simultaneously write 2z bit words to it, while retrieving z-bit words. The output of Info_RAM 1830 is connected to LBS 1840. ROM_H1 1820 is connected to info_RAM 1830 and LBS 1840. ROM_H1 1820 delivers at its output its contents serially accessed and one-by-one.

A part of a word retrieved from ROM_H1 1820 is driven to Info_RAM 1830 to select a particular group of information bits.

Another part of the same word from ROM_H1 1820 is driven to LBS 1840 and defines the amount of bit positions that the word retrieved from info_RAM 1830 is rotated. LBS 1840 delivers its output to accumulator 1850 which sums all its inputs until a z-bit result p1 is formed.

The particular result is then output from Unit_1 1800 and accumulator 1850 is reset to start a new computation.

Figure 24:
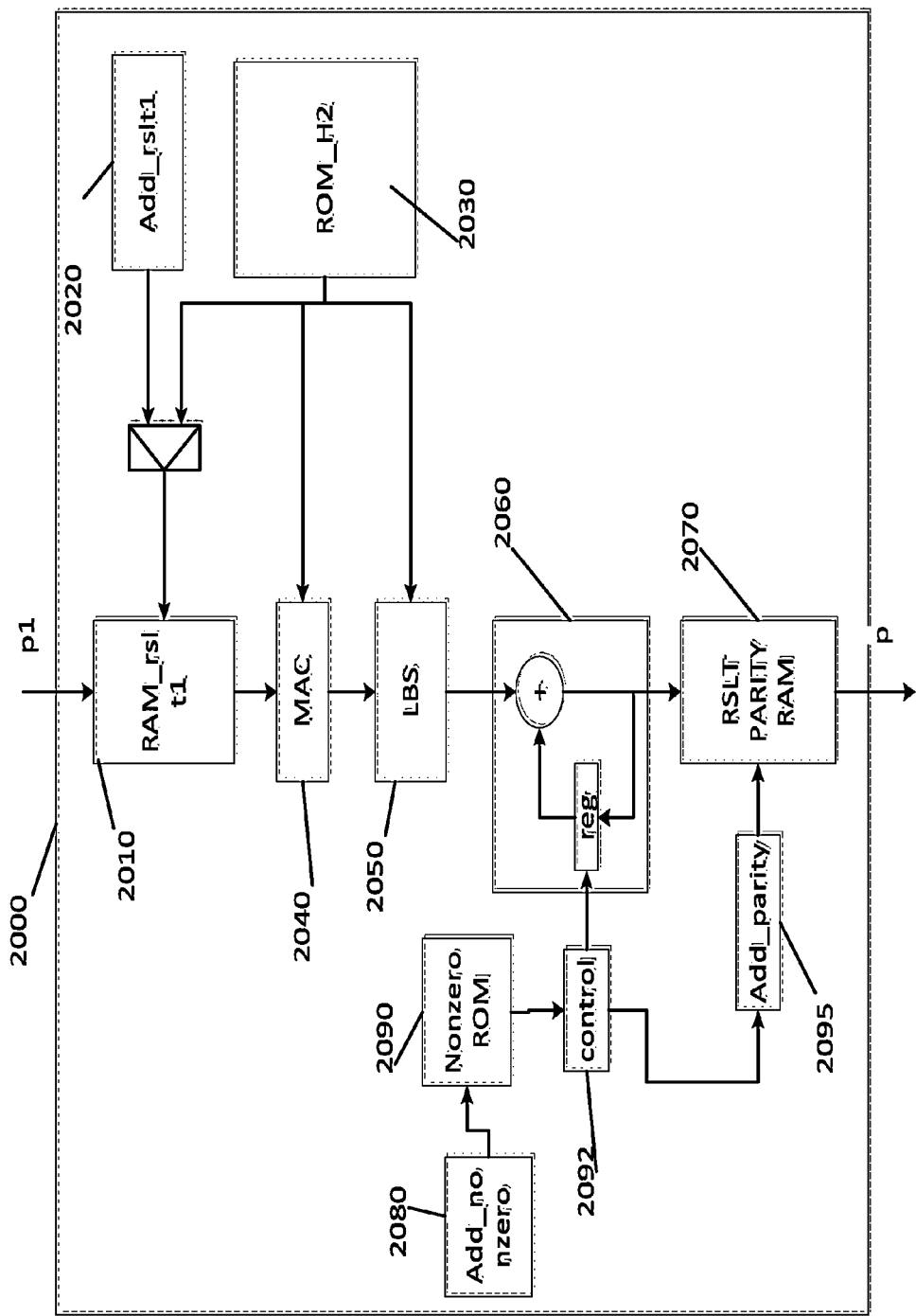
FIG. 24 depicts an embodiment of Unit 2 2000 (1432).

FIG. 24 depicts an embodiment of Unit 2 2000 (1432). Unit 2 2000 computes the product p2=p1 H2tinv and comprises a rslt1_RAM memory 2010, an address generator Add_rslt1 2020, an ROM_H2 2030, a MAC 2040, an LBS 2050, an accumulator 2060, an output RSLT parity RAM memory 2070, the corresponding address generator add_parity 2095, the nonzero ROM 2090 and the corresponding address generator Add_nonzero 2080, and Control 2092. Input p1 from Unit_1 (1800) is initially stored in rslt_RAM 2010 at locations as produced by Add_rslt1 2020. ROM_H2 2030 is connected via a multiplexer to rslt1_RAM 2010, to the MAC 2040 and LBS 2050. ROM_H2 2030 contains words, each partitioned in three parts and describing the location of z-bit word stored in rslt1_RAM 2010, the particular matrix by which this z-bit word is multiplied in the MAC 2040, and the amount by which the output of the MAC 2040 is rotated by the LBS 2050 which receives as input the output of MAC 2040 and a part of a word stored in ROM_H2 2030. The output of LBS 2050 is accumulated in the accumulator 2060.

The number of partial results produced in LBS 2050 and accumulated in Accumulator 2060 is determined by Control 2092. Control 2092 receives as input the number of nonzero elements contained in the columns of the H2$t$_inv matrix for which the operation is currently performed.

This number is provided to Control 2092 by nonzero_ROM 2090 at locations provided by address generator add_nonzero 2080. Control 2092 also controls address generator Add_parity 2095, which provides addresses to RSLT parity RAM 2070 also connected to Accumulator 2060. Add_parity 2095 determines the location in RSLT parity 2070, where a result from the Accumulator 2060 will be stored. The result parity bits p are computed by Accumulator 2060 and stored in RSLT parity RAM 2070.

Figure 25:
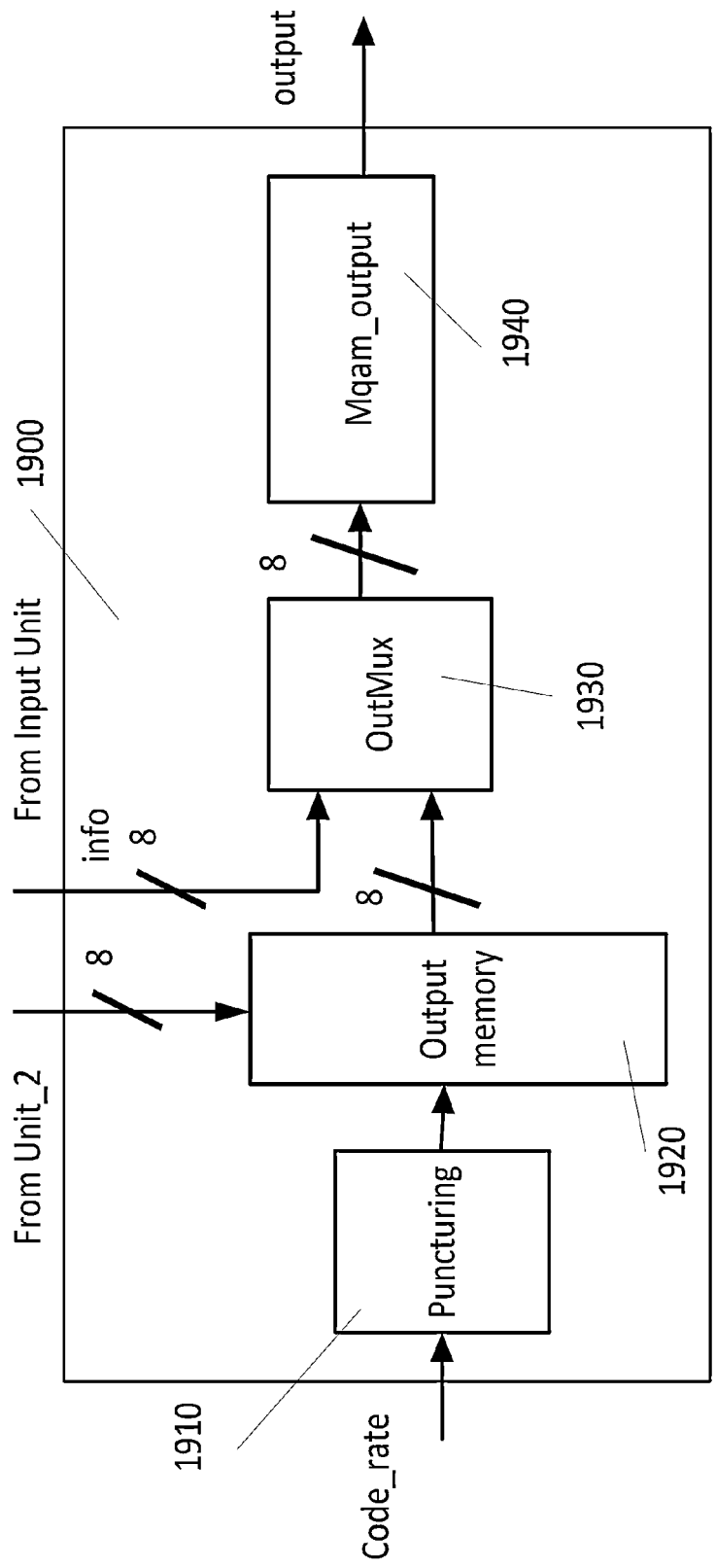
FIG. 25 depicts Encoder Output 1900 (1440).

FIG. 25 depicts Encoder Output 1900 (1440). Encoder Output 1900 contains Puncturing 1910, Output memory 1920, OutMux 1930 and mqam_output 1940. Depending on the code rate requirements, Puncturing 1910 decides which of the computed parity bits are transmitted from the output memory 1920 through Outmux 1930 to the mqam_output 1940, which rearranges the codeword bits into groups of size required by the modulation scheme. Mqam_output 1940 implements 4500 for the case of constant input bit group size of Xmax=2*z, and produces output groups of variable size Y, defined during operation. In the exemplary embodiment, the values of Y supported are Y=2, 3, . . . 8.

Figure 26:
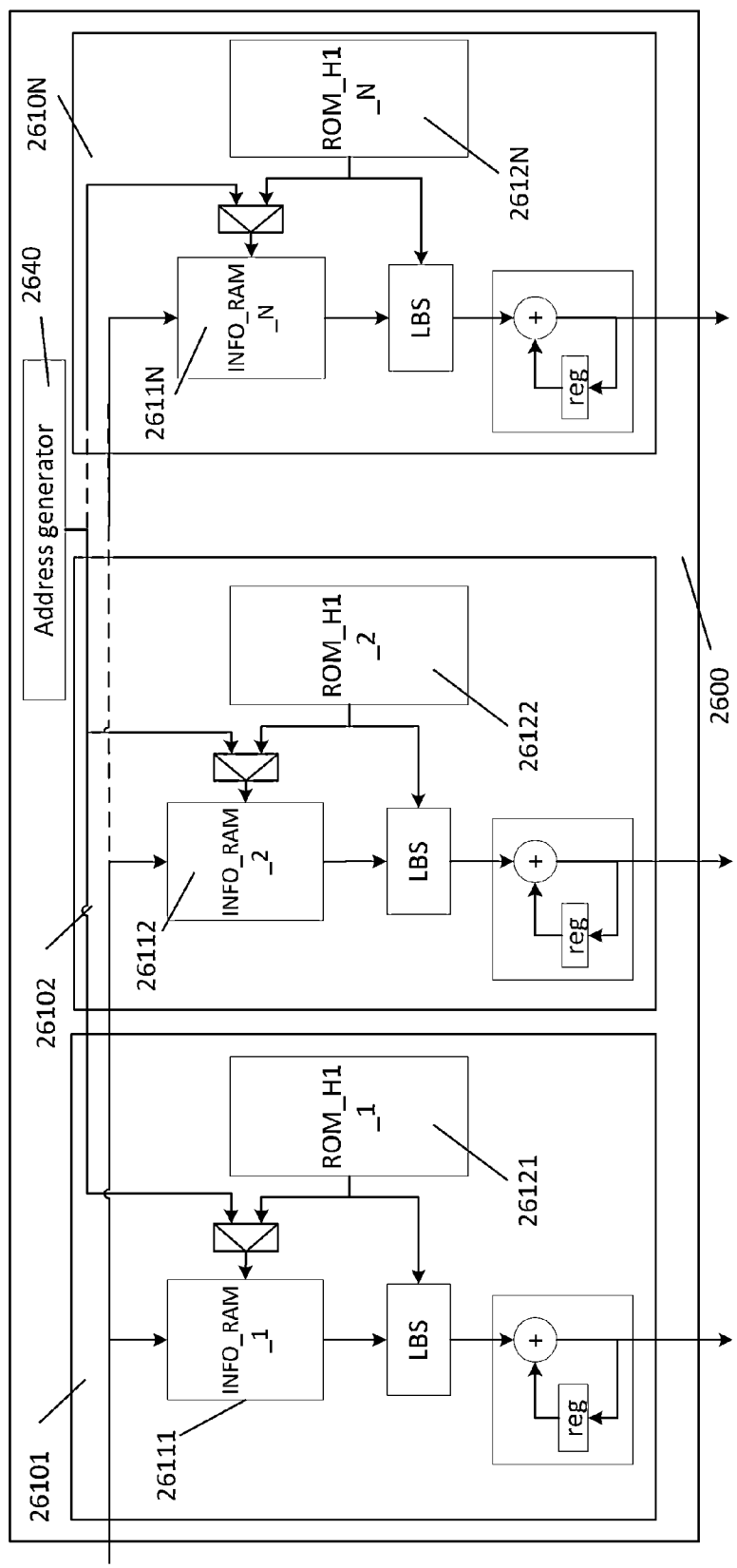
FIG. 26 depicts a parallel processing embodiment of Unit_1 2600, which consists of N identical processing elements 2610

FIG. 26 depicts a parallel processing embodiment of Unit_1 2600. Unit_1 2600 is an alternative to the implementation of Unit_1 described as 1800. A possible parallel Unit_1 2600 contains N processing elements (26111-2611N) of identical structure. QAM_input stores information bits into a bank of independent memories each associated with a processing element. Each processing element (26111-2611N) resembles the structure of 1800. It differs from 1800 in RAM 2620, which is smaller as it contains the information bits to be processed by the particular processing element, and in ROM_H2_1 2630, which contains the part of matrix H1 which corresponds to the fragment of the computation undertaken by the particular processing element. Similarly for the remainder of the memories ROM_H2_i, i=1, 2, . . . , N. The particular parallel implementation is memory-access conflict free. An address generator 2640 is responsible for determining the location in each memory, where an input is stored.

Figure 27:
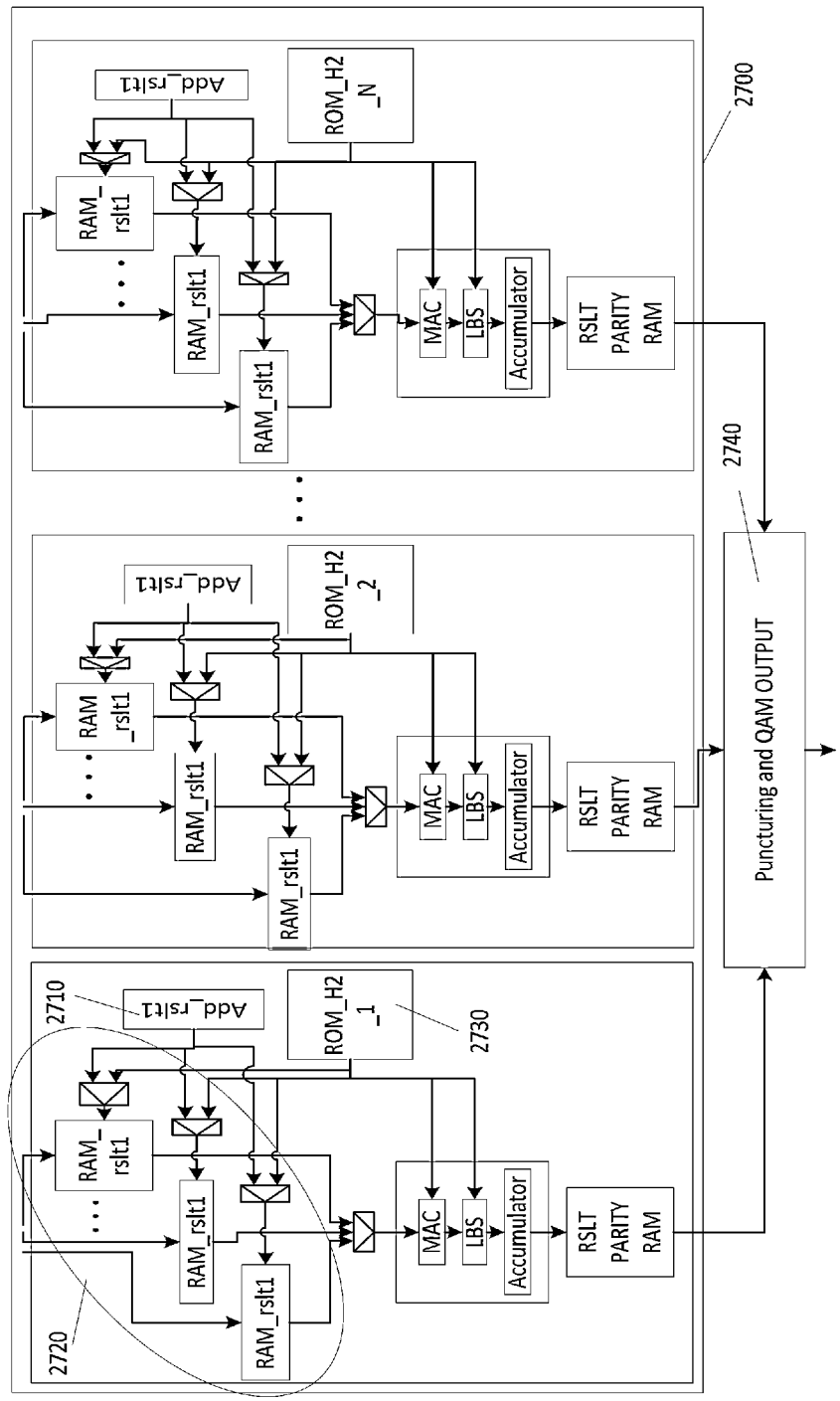
FIG. 27 depicts a parallel embodiment of Unit_2 2700, which consists of N identical processing elements 2710.

FIG. 27 depicts a parallel embodiment of Unit_2 2700, which consists of N identical processing elements 2710. Each of the processing elements 2710 resembles the serial embodiment of Unit_2 2000. Unit_2 processing element 2710 differs from 2000 in that it contains a set of independent memories 2720, each receiving data from an output of the parallel implementation of Unit_1 2600. Furthermore, ROM_H2 2730 in each Unit_2 processing element 2710, contains information regarding only the fragment of the overall computation that is executed by the specific processing element. The outputs of all processing elements are driven into an output unit 2740 which forms the final result.

In the following figures a number of flow diagrams are given and analyzed which describe the procedure used for deriving a parity check matrix H with minimum number of small cycles in a Tanner graph, along with the organization of the various memory subunits of the Channel encoder as well as a technique for deriving the contents of these memories by extracting the appropriate information of matrix H.

Figure 28:
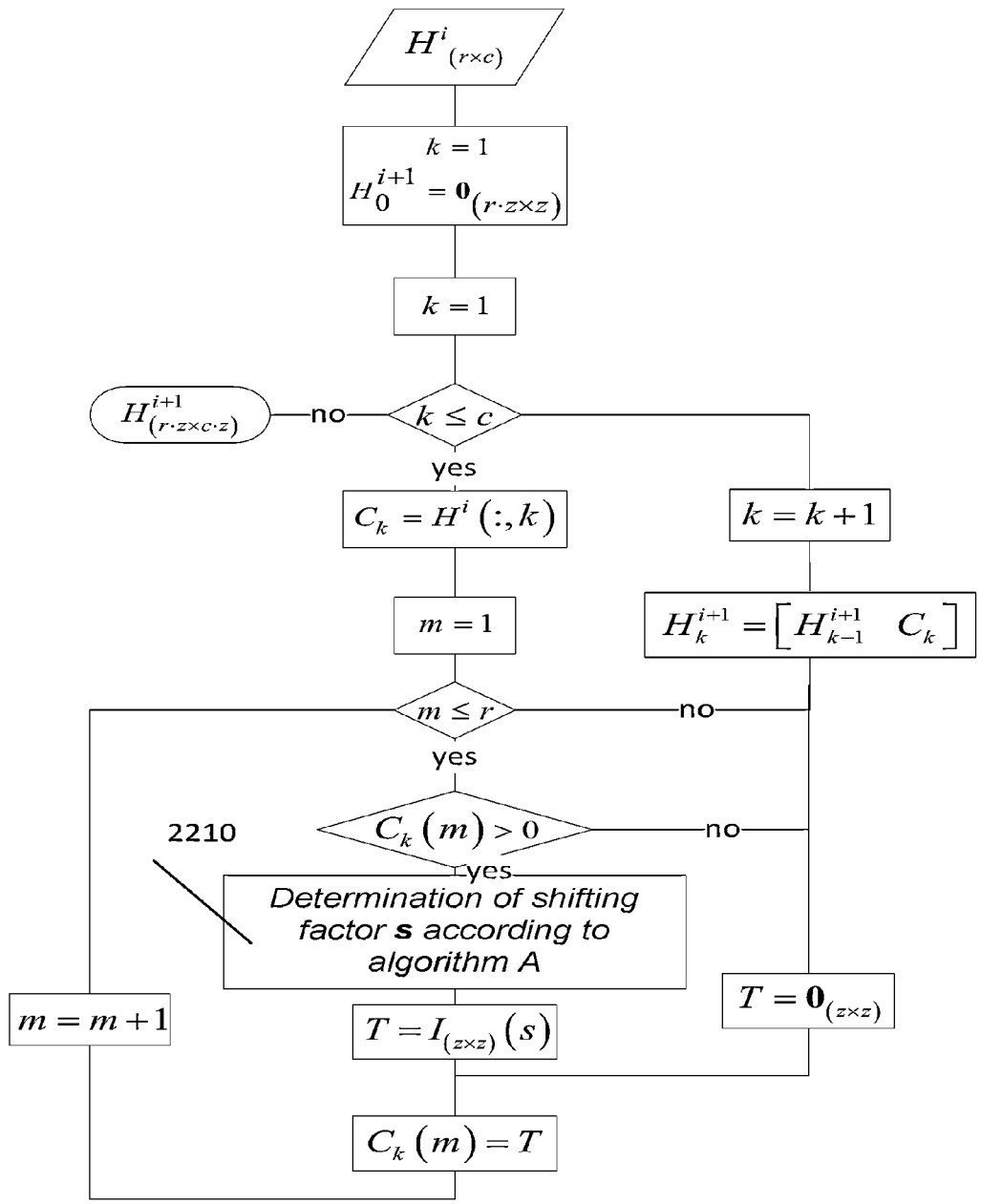
FIG. 28 depicts a flow diagram of the iterative method for the construction of a parity check matrix, according to another exemplary embodiment.

FIG. 28 depicts a flow diagram of the iterative method for the construction of a parity check matrix, according to another exemplary embodiment. The parity check matrix is constructed by extending a base matrix. Block 2210 determines the shifting factors to be used in particular column. According to the method, for a given r×c base matrix H(i), an H(i+1) matrix is constructed. H(i+1) is a zr×zc matrix and is constructed according to the following rule: For each k column of H(i) a zr×z size column $C_k$ is constructed according to the following steps: (a) replacing each zero by a zero z×z sub-matrix, (b) replacing each unit by a z×z right shifted identity sub-matrix, having a shifting factor equal to s, where s is particular to each sub-matrix, and (c) Constructing $H_k$(i+1)=[$H_{k-1}$(i+1)$C_k$], where column $C_k$ is constructed according to an algorithm (A) that introduces the least number of cycles of size 6 in the Tanner graph.

Figure 29:
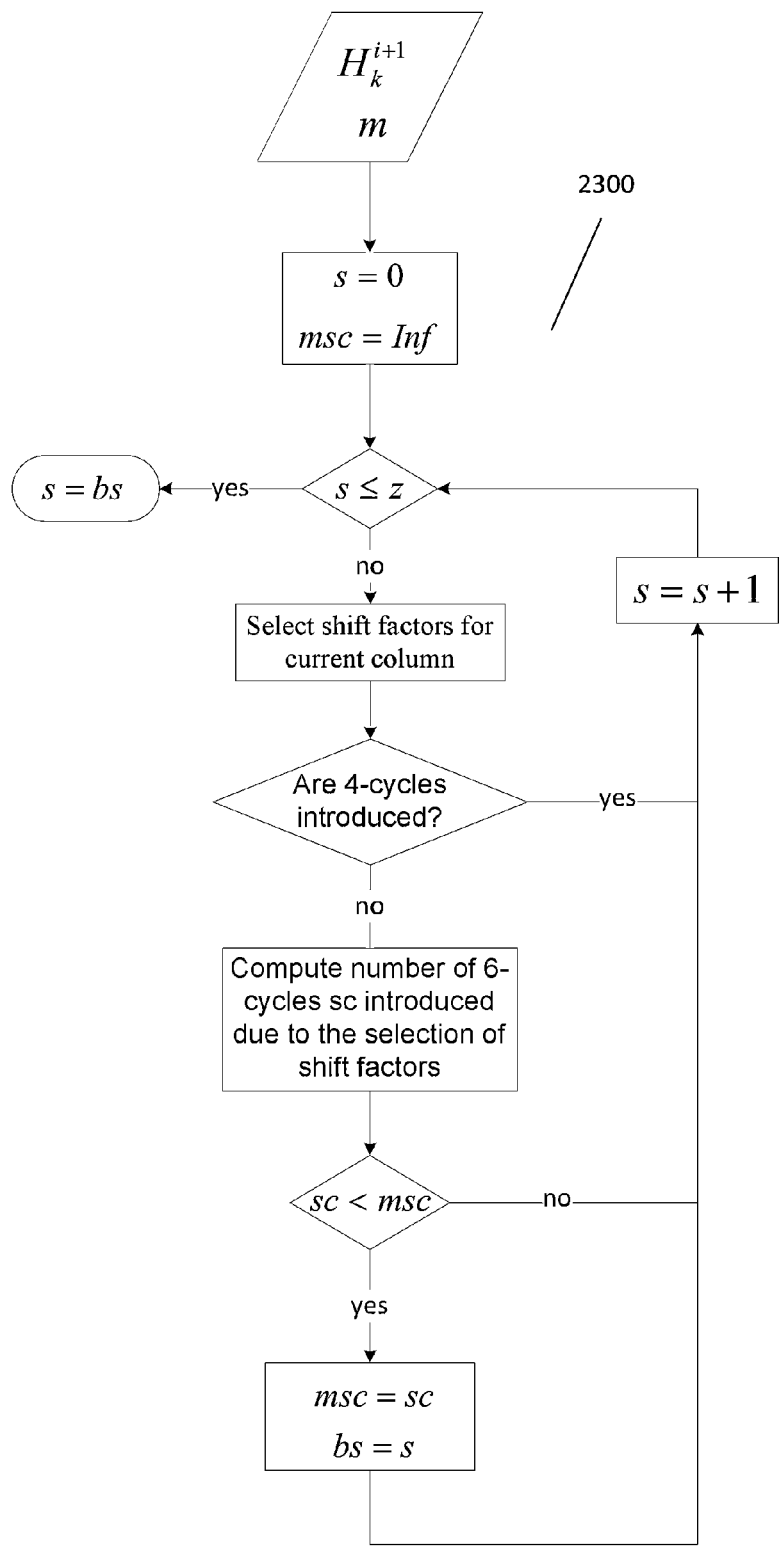
FIG. 29 is a flow diagram of algorithm A.

FIG. 29 is a flow diagram 2300 (2210) of algorithm A. Given a part of an extended parity check matrix, algorithm A derives shift factors to be used for the extension of a column of the base matrix, such that no four-cycles are introduced, while a minimal number of six-cycles is introduced. For a given number N of sets of shifting factors s, the set that introduces the least number of cycles of size 6 in the Tanner graph is selected. It is noted that by introducing additional constraints in the selection of the shifting factors significant benefits in the system implementation can be achieved. In particular by limiting the shifting factors used to extend a particular column of the base matrix to be identical, the structure of H2tinv is significantly simplified, thus leading to simpler and faster execution of the multiplication of a vector by H2Tinv, a task undertaken by Unit 2.

Figure 30:
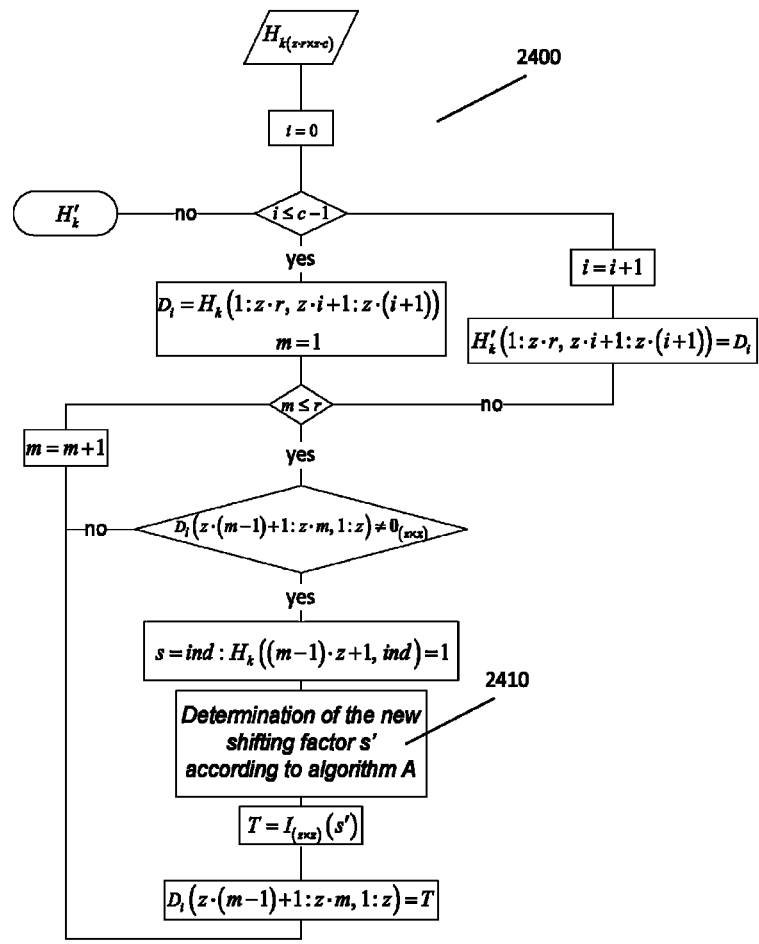
FIG. 30 is a flow diagram of a method for the minimization of the number of small cycles in a Tanner graph.

FIG. 30 is a flow diagram 2400 of a method for the minimization of the number of small cycles in a Tanner graph. For a given matrix $H_k$ a matrix $H_k'$ is constructed as follows: For each i=0, 1, . . . , c−1, a zr×z matrix $D_i$ is defined comprising columns zi+1 up to z(i+1) of matrix $H_k$. Then the shifting factors that correspond to matrix $D_i$ using algorithm A are redefined. Block 2410 implements algorithm A, i.e., the algorithm 2300.

The organization of the main memory subunits involved in Unit1 and Unit 2 of the Channel Encoder (ROM_H1 and ROM_H2) as well as a technique for deriving the contents of the memories according to the information carried by the check matrix H are described in FIGS. 31-33 analyzed below FIG. 31 depicts the organization of words stored in ROM_H1 3300 (1820). Each word 3310 contains two parts, namely the index of a nonzero sub-matrix 3311 and the corresponding shifting factor 3312. In this example let's assume that the H matrix is constructed in two steps. First using $z_1 \times z_1$ sub-matrices and then $z_2 \times z_2$ sub-matrices. Although it is possible to take advantage of both steps for better compression and parallelism, in the present example we employ only the second step. For $z_2=4$, matrix $H_1^T$ includes $z_2 \times z_2$ zero and non-zero identity circulant sub-matrices. Only the positions of the non-zero sub-matrices are stored, for each column of $H_1^T$. Additionally, the number of non-zero sub-matrices in each column of $H_1^T$ is stored.

Figure 32:
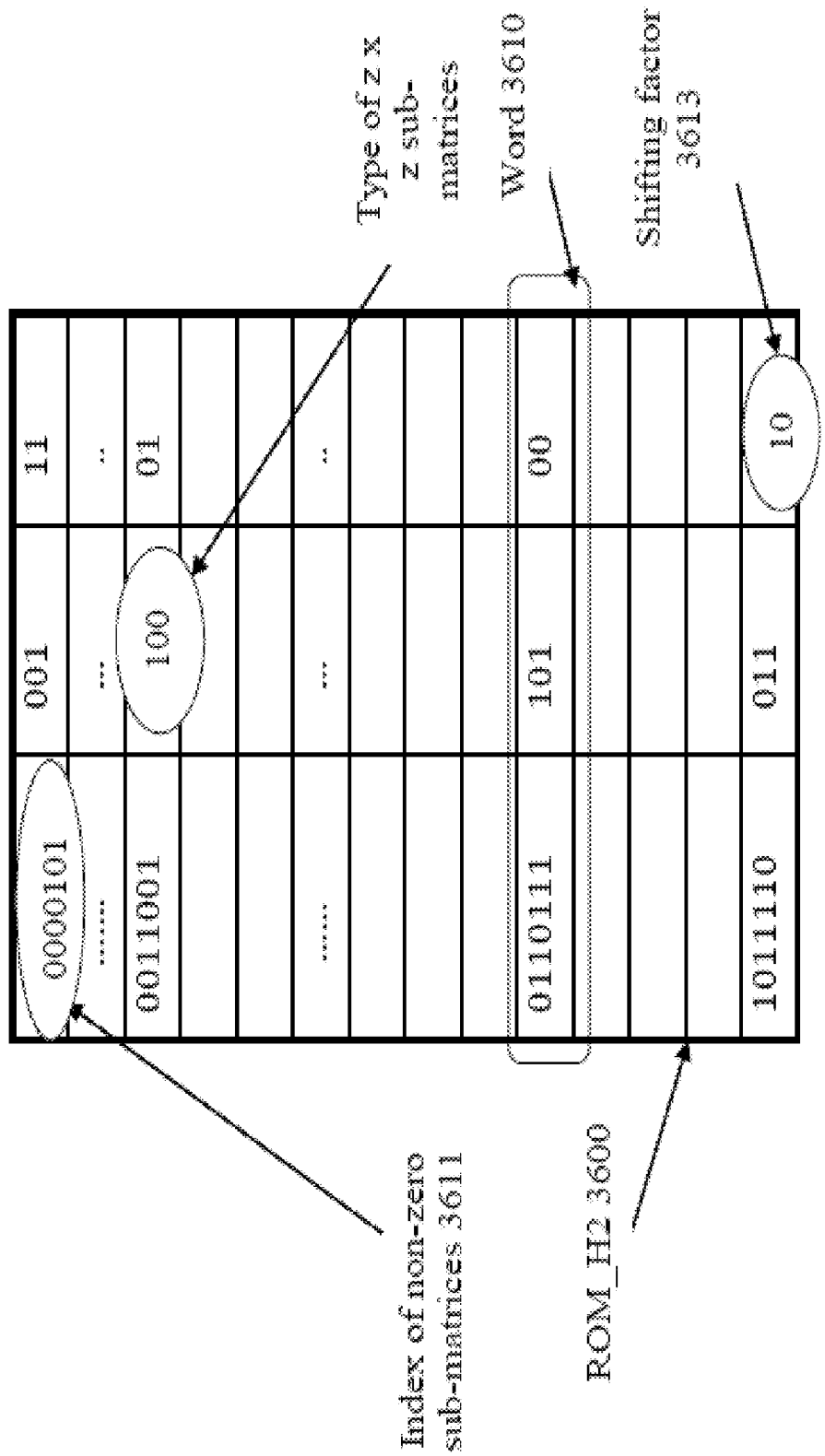
FIG. 32 depicts the contents of memory ROM_H2 3600 (2030).

FIG. 32 depicts the contents of memory ROM_H2 3600 (2030). Each entry corresponds to a nonzero element in a base matrix that generates the contents of ROM_H2 3600. Each entry 3610 has three parts, namely the index of nonzero sub-matrices 3611, which is the location of the nonzero element in a column (i.e. the row), the type of the matrix by which a z-bit sub-word of the input bit vector p1 to Unit 2 2000 should be multiplied with, and the Shifting factor 3612 which denotes the amount of bit positions by which the result of the multiplication performed by MAC 2040 should be bit-wise rotated.

Figure 33:
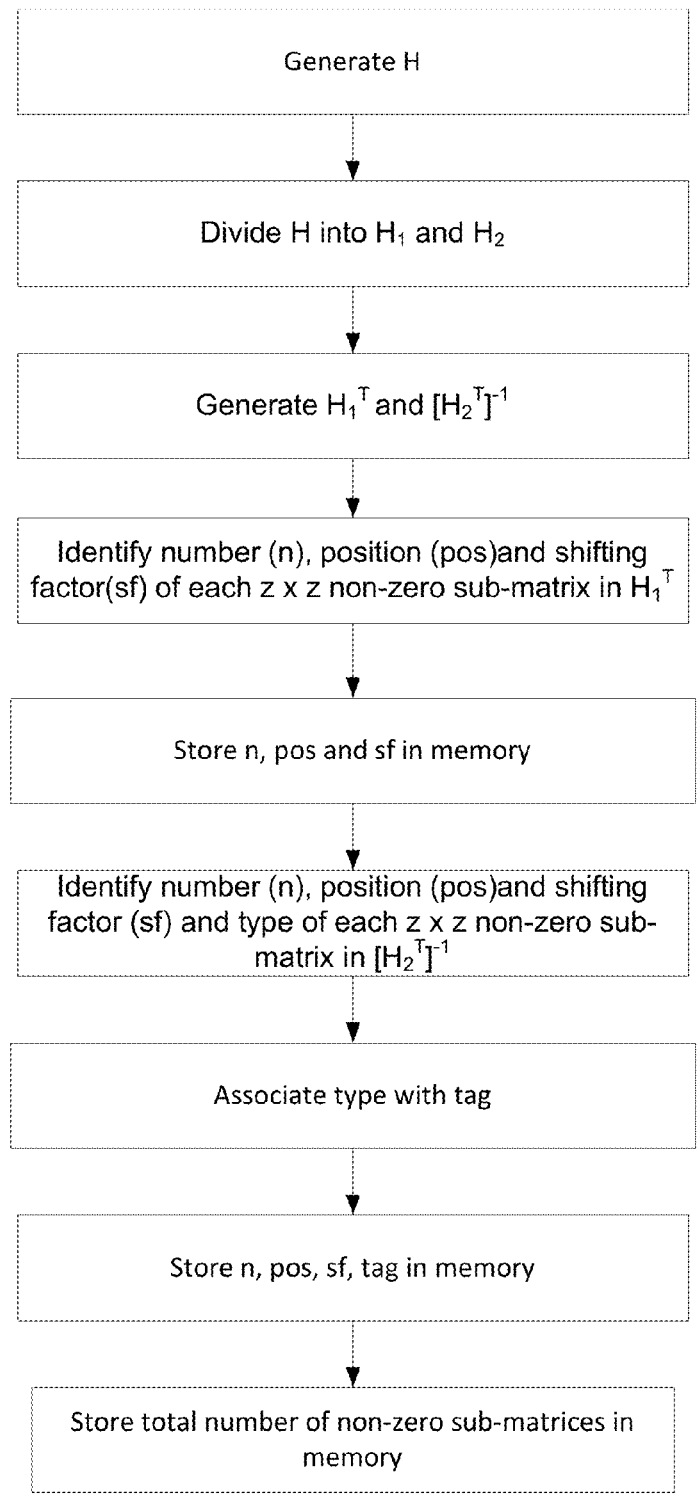
FIG. 33 depicts a procedure for deriving the contents of the memories where information relevant to the parity check matrix H is stored.

FIG. 33 depicts a procedure for deriving the contents of the memories where information relevant to the parity check matrix H is stored, namely the contents of ROM_H1 3300 (1820) and ROM_H2 3600 (2030). In a first step, an extended parity check matrix is generated. Then, in a next step, the extended matrix is divided into $H_1$ and $H_2$. In a further step, the transposed $H_1^T$ and the inverse transposed $[H_2^T]^{-1}$ are generated. Next the number, position and shifting factor of all non-zero z×z sub-matrices in $H_1^T$ are identified for each column. Next, the number, the position and the shifting factor are stored in a memory. In a next step, the number, position, type and shifting factor of each type of non-zero sub z×z sub-matrices in $[H_2^T]^{-1}$ are identified. It should be noted that the non-zero z×z sub-matrices in $[H_2^T]^{-1}$ belong to a discrete set of permuted sub-matrices. These types are associated with a tag. In another step, the unique sub-matrix types, their position in each column of $[H_2^T]^{-1}$, their tags and the relevant shifting factors are stored in another memory. In a next step, the total number of non-zero sub-matrices per column is stored.

As aforementioned, an identical procedure to that described in [00113] can be followed for any factorization of $(H_2^T)^{-1}$, say $(H_2^T)^{-1}=A \cdot B$, and that in such a case, parity bits due to Equation 7 may be computed as $p=_1 \times AB$, and matrices A and B may be compressed using the method described to compress $(H_2^T)^{-1}$ whereas an example of such a factorization may be derived through using, LU decomposition. These cases are presented and described in FIG. 28-32

Figure 34:
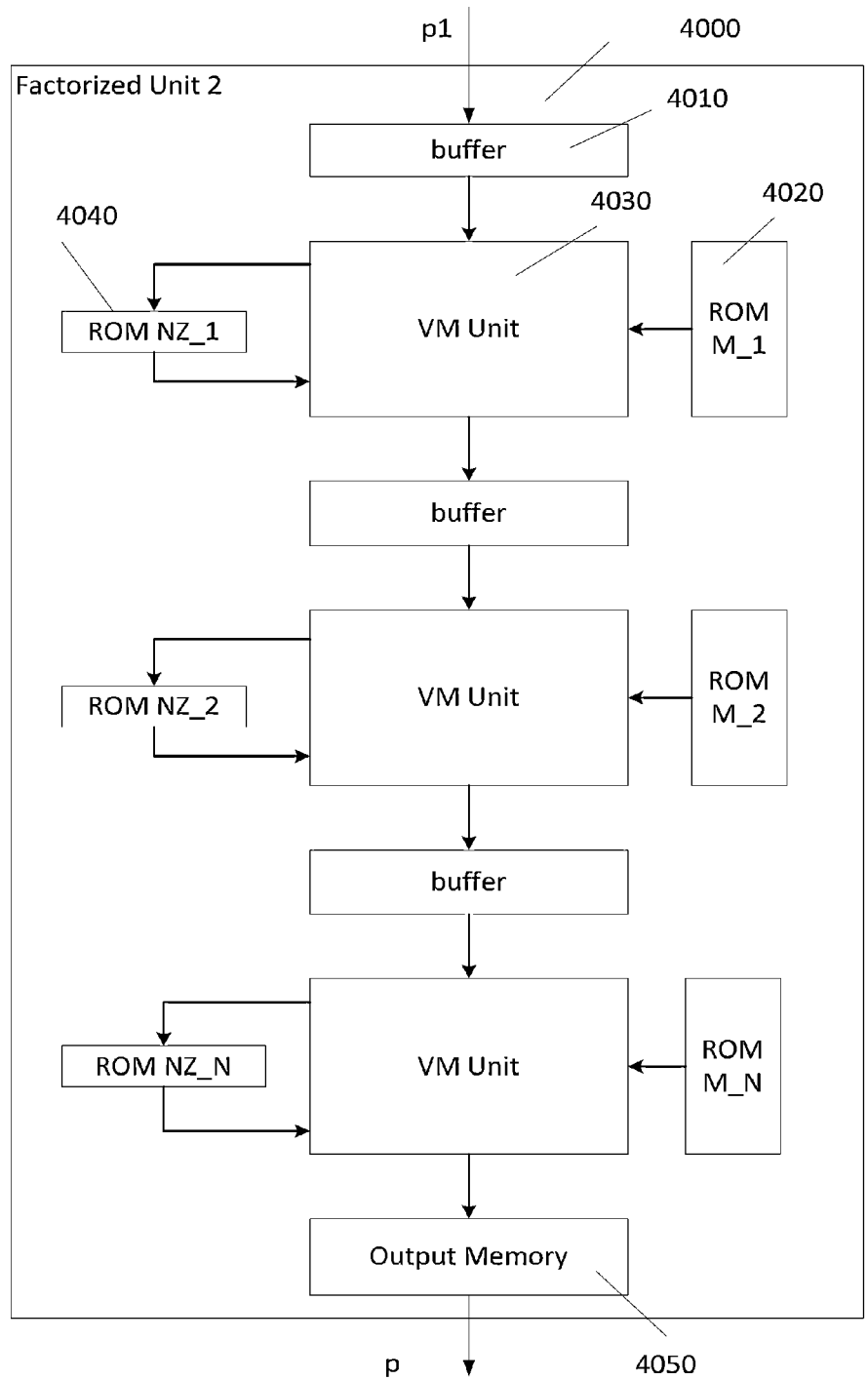
FIG. 34 depicts Factorized Unit 2 4000, which is a general factorized implementation of Unit_2 1432.

FIG. 34 depicts Factorized Unit 2 4000, which is a general factorized implementation of Unit_2 1432. Factorized Unit 2 4000 utilizes a factorization of matrix H2Tinv into a product of matrices M_1, M_2, . . . , M_N in order to perform the multiplication of input bits p1 by matrix H2Tinv and produce the parity bits p. Factorized Unit 2 4000 contains N Buffers 4010, which are memories that store intermediate results, and N identical VM units 4030, each of which multiplies its input coming from buffer 4010 by the corresponding matrix M_N stored in ROM M_N 4020. Each of the VM Units 4030 reads the number of nonzero elements per column of matrix M_N, from a ROM NZ_N 4040. The parity bits computed by the VM Units are stored in Output memory 4050. The final result p is read from Output memory 4050.

Figure 35:
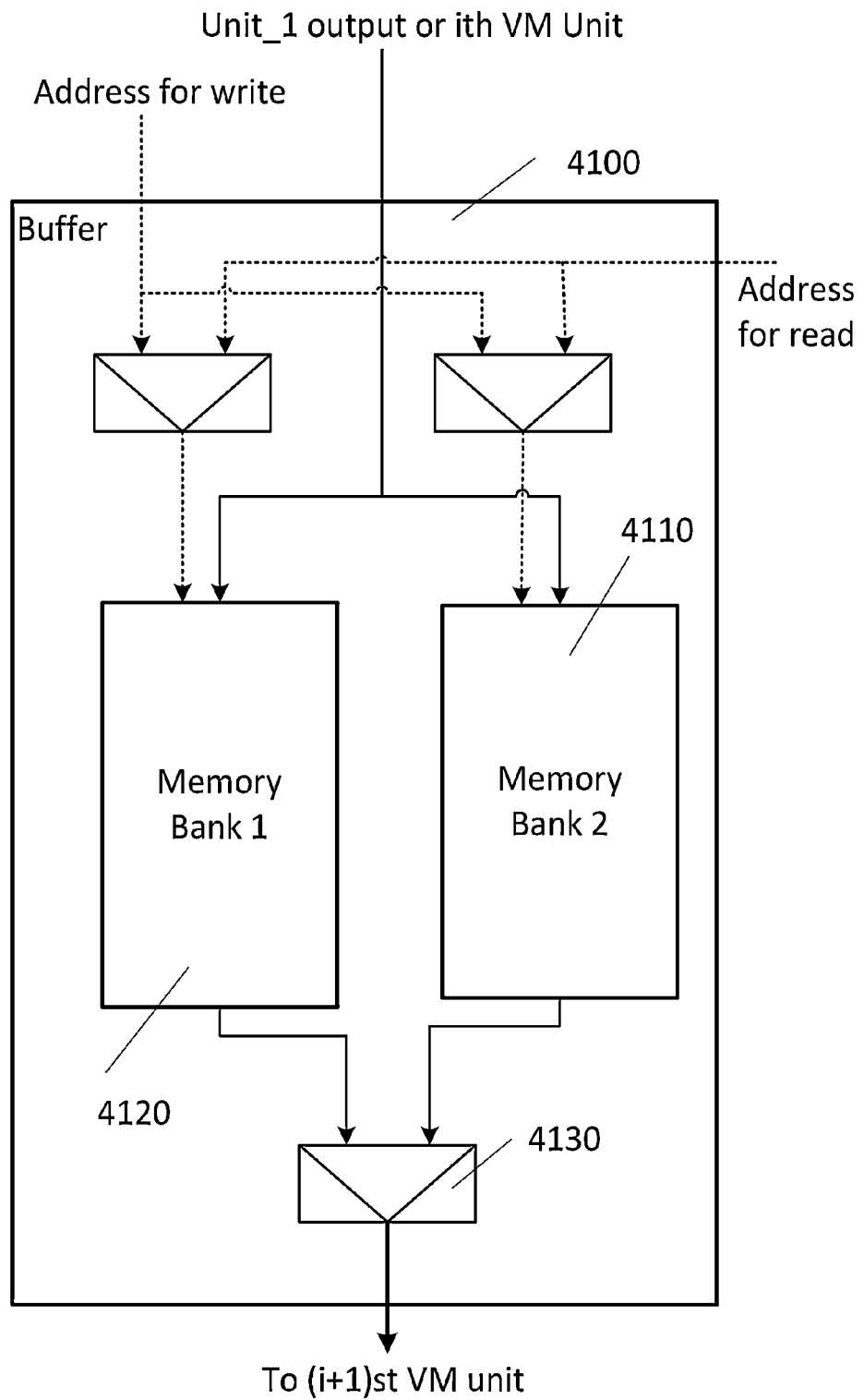
FIG. 35 depicts Buffer 4100 (4010).

FIG. 35 depicts Buffer 4100 (4010). Buffer 4100 comprises Memory Bank 1 4120 and Memory Bank 2 4110 and the output multiplexer 4130. Buffer 4100 receives the output of the ith VM Unit or of Unit_1 and provides its output to (i+1)st VM Unit. Buffer 4100 can function as a two-port memory that allows writing to one bank, while reading from the other bank to permit simultaneous pipelined operation of the VM Units that are connected to it.

Figure 36:
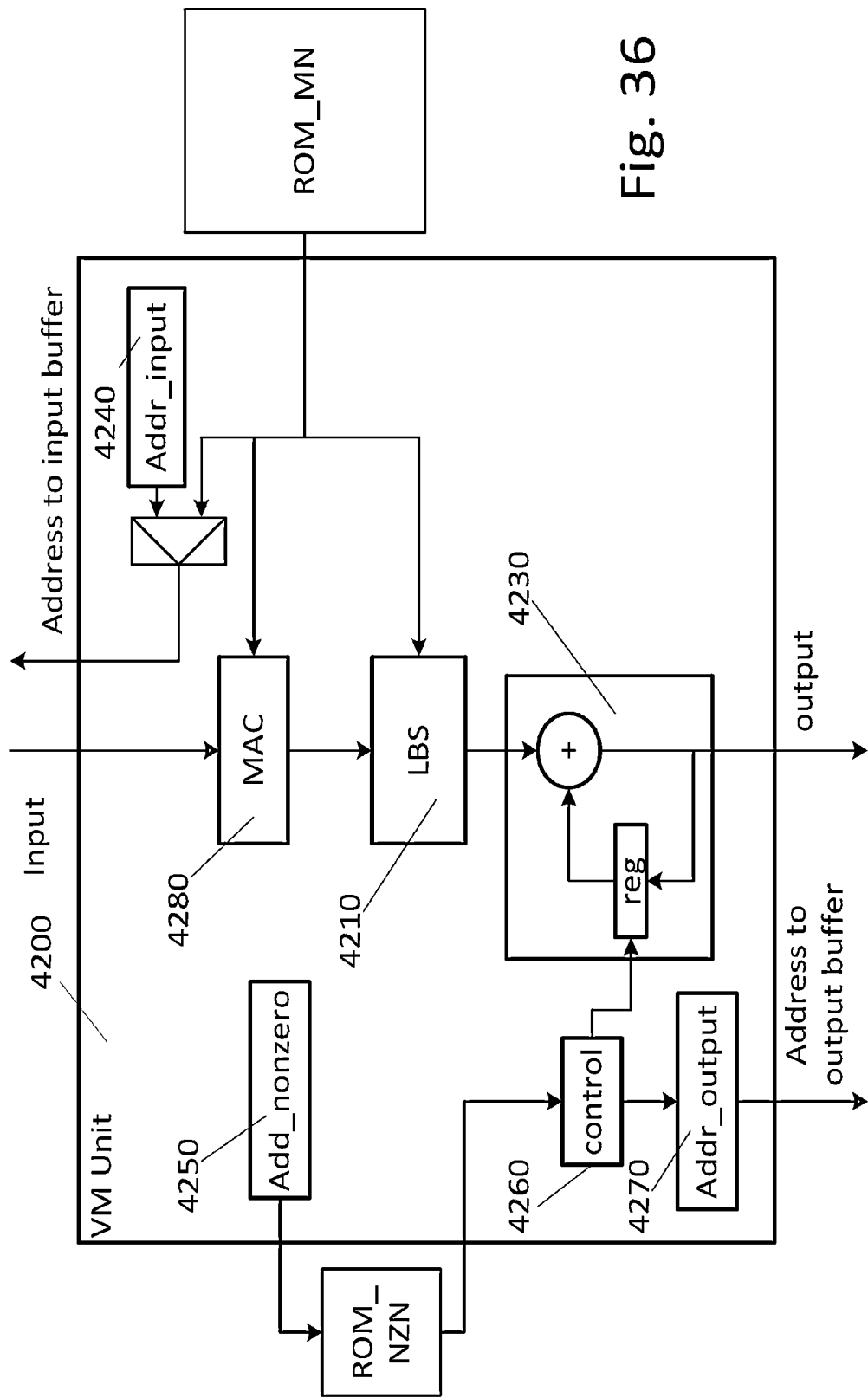
FIG. 36 details VM Unit 4200 (4030), according to another exemplary embodiment.

FIG. 36 details VM Unit 4200 (4030). VM Unit 4200 performs multiplication of its Input bit vector by a matrix M_N, stored in ROM_MN, the number of nonzero elements per column of which is stored in ROM_NZ_N. VM Unit 4200 is a simplification of Unit_2 2000 in the sense that it does not include memories 2090, 2010, 2030, 2070. The remainder of the structure is identical. VM Unit 4200 utilizes a MAC 4280 to multiply the input z-bit vector by the appropriate sub-matrix and subsequently it uses an LBS 4210 to appropriately rotate the output of the MAC 4280. Accumulator 4230 adds the number of partial results that correspond to each column of the matrix M_N and outputs the result. The number of partial results required per column is stored externally to VM Unit 4200.

Figure 37:
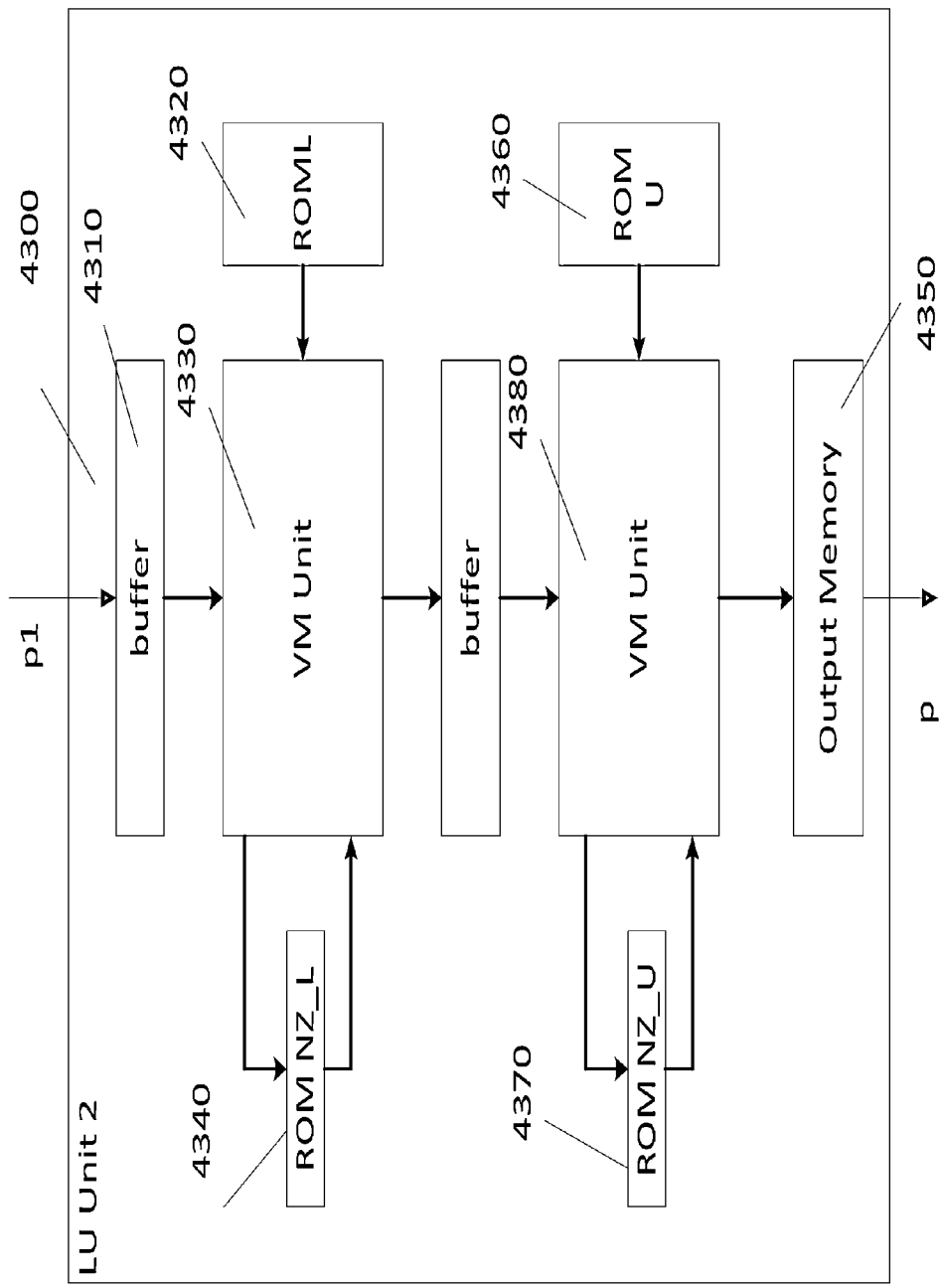
FIG. 37 depicts LU Unit 2 4300, according to another exemplary embodiment.

FIG. 37 depicts LU Unit 2 4300, according to another exemplary embodiment. LU Unit 2 4300 is a possible embodiment of the Generalized Unit 2 4000, for the case of using LU decomposition to factorize matrix H2Tinv. For this case, two identical VM units 4330 and 4380 are used. Information of matrices L and U is stored in ROM L 4320 and ROM U 4360 respectively, while the numbers of nonzero elements for the two matrices L and U are stored in ROM_NZ_L 4340 and ROM_NZ_U 4370, respectively.

It should be noted at that point that the iterative construction of H allows for an iterative compression of $(H_2^T)^{-1}$ similarly to the storage of $H_1$. Based on this, a technique for reducing the memory size of submatrix H1 contained in ROM_H1 (1820) of Unit 1 by computing rather than storing part of its contents is described in FIG. 38. Specifically, as FIG. 31 depicts a large contribution to the size of memory needed for matrix H1 is due to the storage of indices of the nonzero elements. In the case of iteratively constructed codes, this information can be further compressed thus reducing the size of memory required to store matrix H1. The same approach can be used for storing any part of H, or for matrix H as a whole.

Figure 38:
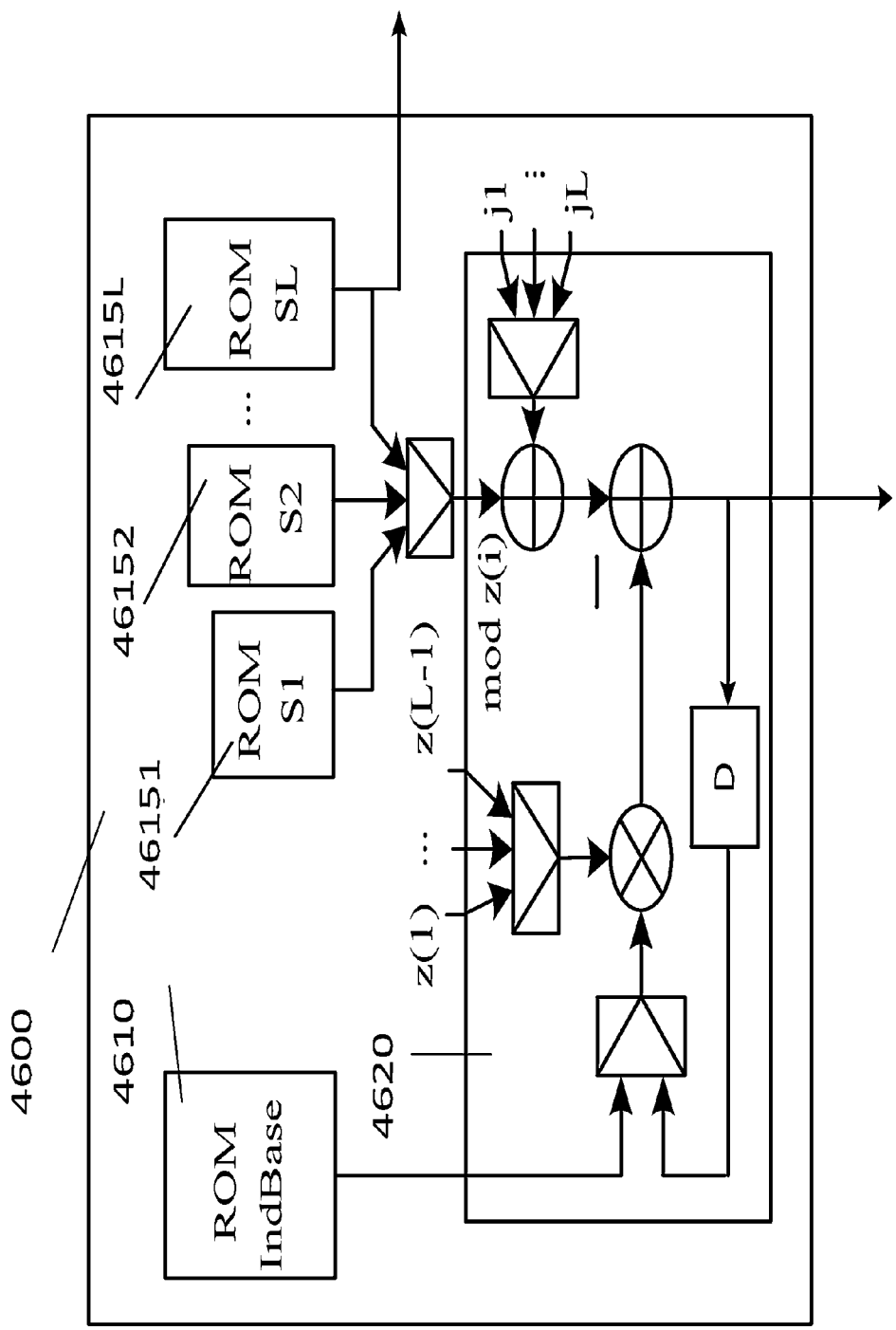
FIG. 38 depicts a technique for reducing the storage required by the indices of the nonzero elements for H1 or any part of H In the case of iteratively constructed codes

FIG. 38 depicts the architecture of Index Computation Circuit 4600 which retrieves the index required for the operation of Unit 1 by explicitly computing it, by utilizing information regarding the base matrix only, and the shifts used in the various extension steps. Therefore Index Computation Circuit 4600 can replace RAM_H1 1820. Index Computation Circuit 4600 computes addresses (row positions of nonzero elements of the last extension step) provided to Info_RAM 1830.

In addition it provides shifting factors to the LBS 1840. Index computation Index Computation Circuit 4600 uses the indices of nonzero elements of the base matrix stored in IndBase ROM 4610, the sizes of submatrices, (z(i)), of each extension step, (i), and the corresponded shifting factors, (S1, S2, . . . , SL) stored in ROMs 46151, 46152, 4615L respectively, to determine the indices of nonzero submatrices required by Unit 1 to execute the multiplication by H1T. Data from ROMs 46151, 46152, 4615L and ROM IndBase 4610 enter Logic Unit 4620 which recursively computes the required indices. Let Ind(i+1,j) denote then index of a non-zero element in the jth column of a (i+1)st extension matrix. Then Ind(i+1,j)=(Ind(i)*zi)−mod(si−j,zi), where Ind(i) is the corresponding index in the previous extension matrix, si is the corresponding shift factor, zi×zi is the size of the submatrix by which the extension is performed, and In the exemplary embodiment it holds that L=2, corresponding to the two-levels of extension. Furthermore the Index Computation Circuit can be used to implement 3930 in the Encoder—Decoder Core 3900. Also it can be used in the Control Unit 810 to efficiently store the information of the matrix H, as required by the decoder.

Figure 39:
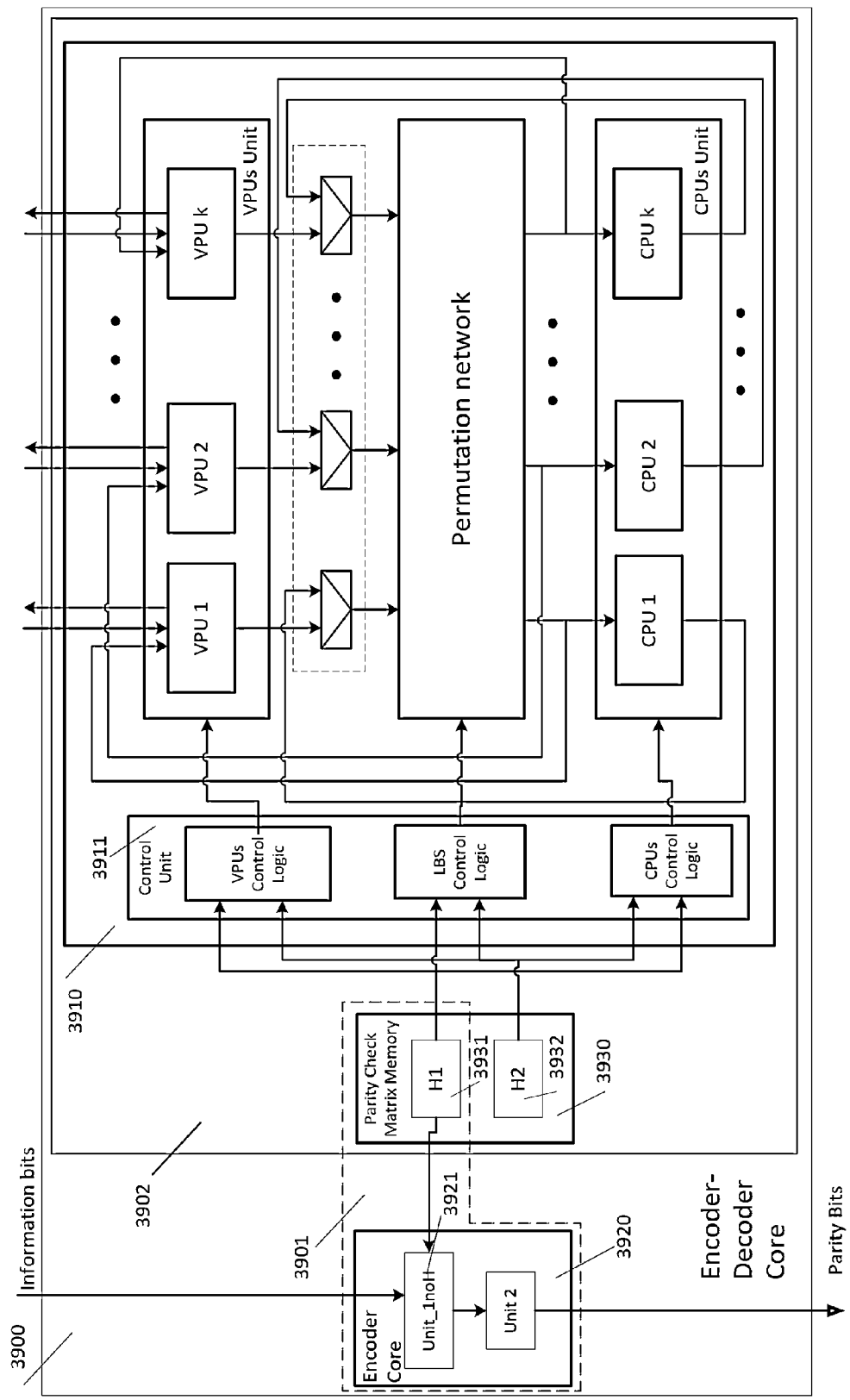
FIG. 39 depicts Encoder Decoder Core 3900 for performing both encoding and decoding tasks according to another exemplary embodiment.

Finally, FIG. 39 depicts a unified Encoder Decoder architecture which performs both encoding and decoding tasks sharing common resources according to another exemplary embodiment. Encoder Decoder Core 3900 is composed of a Simplified Decoder Core 3910, a Simplified Encoder Core 3920 and a Parity Check Matrix Memory 3930. Simplified Decoder Core 3910 is a modification of Decoder Core 800 in that it contains a simplified control unit 3911, which is a simplification of the control unit 810, since it does not include information relevant to the parity check matrix.

This information is stored in the memory unit 3930, which comprises two memories 3931 and 3932. Memory 3931 stores information relevant to the part H1 of the parity check matrix H and memory 3932 stores information relevant to the sub-matrix H2. Similarly Simplified Encoder Core 3920 is a simplification of Encoder Core 1430 in that it contains Unit_1_noH 3921, which is simpler than Unit 1 1431 since it does not store information related to H1.

This information is retrieved from memory 3931, which is shared with the Simplified Decoder Core 3910. For illustrative purposes Encoder Core 3901 is depicted with dotted lines. Encoder Core 3901 comprises Simplified Encoder Core 3920 and Memory 3931. Similarly, Decoder Core 3902 is depicted. Decoder Core 3902 comprises Simplified Decoder Core 3910 and Parity Check Matrix Memory 3930. Thus, Memory 3931 is shared between Encoder Core 3901 and Decoder Core 3902.

The proposed solution in the present disclosure has a number of benefits. More specifically: (i) Higher encoding/decoding speeds, (ii) lower hardware complexity, (iii) effective management of the trade-off between encoding/decoding speed and hardware complexity, (iv) expandability, (v) satisfactory encoding gain, (vi) flexibility and (vii) higher convergence speed.

With respect to expandability, there is a number of sub-benefits: (a) Multiple levels of parallelism due to iterative construction of parity check matrix, (b) compression of matrix H based on the expansion steps and (c) execution of vector-matrix multiplication in the encoder in parallel, by splitting the matrix vertically and/or horizontally adding as many units of parallelism as desired.

With respect to flexibility, an ensemble of LDPC codes are supported and, using the same architecture, there is support for multiple code-word lengths.

Various techniques described herein can be used for various wireless communication systems, such as Code Division Multiple Access (CDMA) systems, Time Division Multiple Access (TDMA) systems, Frequency Division Multiple Access (FDMA) systems, Orthogonal Frequency Division Multiple Access (OFDMA) systems, Single Carrier FDMA (SC-FDMA) systems, and other such systems. The terms "system" and "network" are often used herein interchangeably. A CDMA system can implement a radio technology such as Universal Terrestrial Radio Access (UTRA), CDMA2000, etc. UTRA includes Wideband-CDMA (W-CDMA) and other variants of CDMA. Additionally, CDMA2000 covers the IS-2000, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM®, etc. UTRA and E-UTRA are part of Universal Mobile Telecommunication System (UMTS). 3GPP Long Term Evolution (LTE) is an upcoming release that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). Further, CDMA2000 and UMB are described in documents from an organization named "3rd Generation Partnership Project 2" (3GPP2).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein

What is claimed is:

1. In an encoding device, a method of generating a set of parity bits (p) from a set of information bits (s), comprising:
storing information related to z×z sub-matrices of a first sub-matrix and of a second sub-matrix corresponding to a first and a second portion of a parity check matrix H of a Low Density Parity Check (LDPC) code, respectively, to allow representation of the parity check matrix in a compressed form; and
generating the set of parity bits p by appropriately multiplying, shifting and accumulating subsets from the set of information bits s based on the stored information, without decompressing the parity check matrix.

2. The method of claim 1, wherein said representation of the parity check matrix in a compressed form comprises iteratively constructing the parity check matrix by extending a base matrix.

3. The method of claim 2, further comprising:
generating the parity check matrix consisting of z×z sub-matrices;
dividing H into $H_1$ and $H_2$ such that $H=[H_1\ H_2]$, where $H_1$ is the first portion and $H_2$ is the second portion; and
generating $H_1^T$ and $[H_2^T]^{-1}$, where $H_1^T$ is the first sub-matrix and $[H_2^T]^{-1}$ is the second sub-matrix.

4. The method of claim 3, further comprising:
storing identified position, shifting factor and total number of non-zero z×z sub-matrices of $H_1^T$ in a first memory;
identifying non-zero z×z sub-matrix types in $[H_2^T]^{-1}$;
associating each identified sub-matrix type with a tag; and
storing unique sub-matrix types, positions, tags and shifting factors in a second memory.

5. The method of claim 4, wherein the LDPC code is a quasi-cyclic LDPC code.

6. An encoding device for generating a set of parity bits (p) from a set of information bits (s), comprising:
storing means for storing information related to z×z sub-matrices of a first sub-matrix and of a second sub-matrix corresponding to a first and a second portion of a parity check matrix (H) of an LDPC code, respectively, to allow representation of the H matrix in a compressed form; and
encoding means, coupled to the storing means, for encoding the set of information bits s, coupled to the storing means, without decompressing the parity check matrix.

7. The encoding device of claim 6, where the means for encoding include first means for appropriately shifting and accumulating subsets from the set of information bits s based on the stored information related to the first sub-matrix to generate an intermediate result and second means for appropriately multiplying, shifting and accumulating the intermediate result based on the stored information related to the second sub-matrix to generate the set of parity bits.

8. The encoding device of claim 7, wherein the second means includes a set of identical units coupled in series, each appropriately shifting and accumulating its input with a factorised portion of the second sub-matrix.

9. In a decoding device, a method of decoding a codeword encoded with an LDPC code, comprising:
storing a received set of k number of Log-Likelihood Ratios (LLRs) in a set of k number of memories, respectively; and
executing k number of parallel variable-to-check and check-to-variable message updating processes, until a decoding iteration is completed; and
repeating the executing step until a termination criterion is met.

10. A decoding device for decoding a codeword encoded with an LDPC code, comprising:
a set of k number of memories for storing a received set of k number of LLRs, respectively; and
a set of k number of decoding units, each coupled to one of the set of k number of memories, respectively, for executing k number of parallel variable-to-check and check-to-variable message updating processes, until a decoding iteration is completed.

11. The LDPC decoder of claim 10, further comprising means for executing functions with the compressed form of the parity check matrix of the LDPC code.

12. The LDPC decoder of claim 11, where each decoding unit comprises a set of parallel Variable Processing Units and a set of parallel Check Processing Units interconnected through a Permutation Network.

13. The LDPC decoder of claim 12 where the number k of the parallel iterative decoding processes is selected among a set of possible values, wherein a higher value denotes higher throughput whereas a lower value denotes lower hardware complexity.

14. An LDPC encoder-decoder comprising:
an encoding part for generating a set of parity bits (p) from a set of information bits (s);
a decoding part for decoding an encoded codeword in parallel; and
a memory, coupled to both the encoding part and the decoding part, wherein the memory is shareable by both the encoding and the decoding part and stores information related to z×z sub-matrices of a first sub-matrix and of a second sub-matrix corresponding to a first and a second portion of a parity check matrix (H) of an LDPC code, respectively, to allow representation of the H matrix in a compressed form.

\* \* \* \* \*